United States Patent
Ray et al.

(10) Patent No.: US 9,704,588 B1
(45) Date of Patent: Jul. 11, 2017

(54) APPARATUS AND METHOD FOR PRECONDITIONING CURRENTS TO REDUCE ERRORS IN SENSING FOR NON-VOLATILE MEMORY

(71) Applicant: SanDisk Technologies LLC, Plano, TX (US)

(72) Inventors: Biswajit Ray, Mountain View, CA (US); Mohan Dunga, Santa Clara, CA (US); Changyuan Chen, San Ramon, CA (US)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 15/069,287

(22) Filed: Mar. 14, 2016

(51) Int. Cl.
*G11C 16/06* (2006.01)
*G11C 16/26* (2006.01)
*G11C 16/04* (2006.01)
*G11C 11/56* (2006.01)
*G11C 7/06* (2006.01)

(52) U.S. Cl.
CPC ............. *G11C 16/26* (2013.01); *G11C 7/062* (2013.01); *G11C 11/5628* (2013.01); *G11C 11/5642* (2013.01); *G11C 16/0483* (2013.01)

(58) Field of Classification Search
CPC ........... G11C 11/5621; G11C 11/5628; G11C 11/5642; G11C 2211/5621; G11C 2211/5634; G11C 7/06; G11C 7/062
USPC .............. 365/185.01, 185.03, 185.2, 185.24, 365/185.17, 185.33, 205, 208, 196, 365/189.06, 189.09, 189.11, 203
See application file for complete search history.

(56) References Cited

U.S. PATENT DOCUMENTS

| 6,836,426 B1* | 12/2004 | Fukushi ................. G11C 7/06 365/145 |
| 6,850,441 B2 | 2/2005 | Mokhlesi et al. |
| 7,092,292 B2 | 8/2006 | Mokhlesi et al. |
| 7,403,421 B2 | 7/2008 | Mokhlesi et al. |
| 7,797,480 B2 | 9/2010 | Mokhlesi et al. |
| 7,864,573 B2 | 1/2011 | Perlmutter et al. |

(Continued)

OTHER PUBLICATIONS

U.S. Appl. No. 14/500,660, filed Sep. 29, 2014.

(Continued)

*Primary Examiner* — Gene Auduong
(74) *Attorney, Agent, or Firm* — Vierra Magen Marcus LLP

(57) ABSTRACT

Reduced errors when sensing non-volatile memory are provided by applying a current spike or preconditioning current for a group of memory cells included a selected cell. During a sense operation, a preconditioning current can be passed through a group of non-volatile memory cells. The preconditioning current is provided prior to applying at least one reference voltage to a selected word line. The preconditioning current may simulate a cell current passing through the channel during a verification phase of programming. The preconditioning current can modify a channel resistance to approximate a state during verification to provide a more stable threshold voltage for the memory cells. Preconditioning currents may be applied selectively for select reference levels, select pages, and/or select operations. Selective application of preconditioning currents based on temperature is also provided.

20 Claims, 16 Drawing Sheets

(56) References Cited

U.S. PATENT DOCUMENTS

| | | | |
|---|---|---|---|
| 8,064,241 B2* | 11/2011 | Morita | G11C 7/08 |
| | | | 365/145 |
| 2004/0223392 A1* | 11/2004 | Ikehashi | G11C 7/06 |
| | | | 365/205 |
| 2010/0039851 A1* | 2/2010 | Morita | G11C 7/08 |
| | | | 365/145 |
| 2015/0228326 A1* | 8/2015 | Jin | G11C 11/4074 |
| | | | 365/189.05 |
| 2016/0005491 A1 | 1/2016 | Yuan et al. | |

OTHER PUBLICATIONS

U.S. Appl. No. 14/601,531, filed Jan. 21, 2015.
U.S. Appl. No. 14/919,472, filed Oct. 21, 2015.
U.S. Appl. No. 14/817,741, filed Aug. 4, 2015.
U.S. Appl. No. 14/928,454, filed Oct. 30, 2015.
U.S. Appl. No. 14/919,154, filed Oct. 21, 2015.
U.S. Appl. No. 14/994,525, filed Jan. 13, 2016.
U.S. Appl. No. 14/967,157, filed Dec. 11, 2015.
U.S. Appl. No. 14/574,110, filed Dec. 17, 2014.
U.S. Appl. No. 15/354,446, filed Nov. 17, 2016 by Puthenthermadam et al.

* cited by examiner

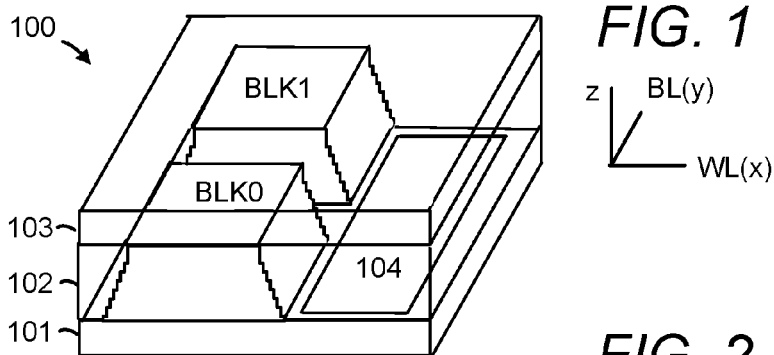
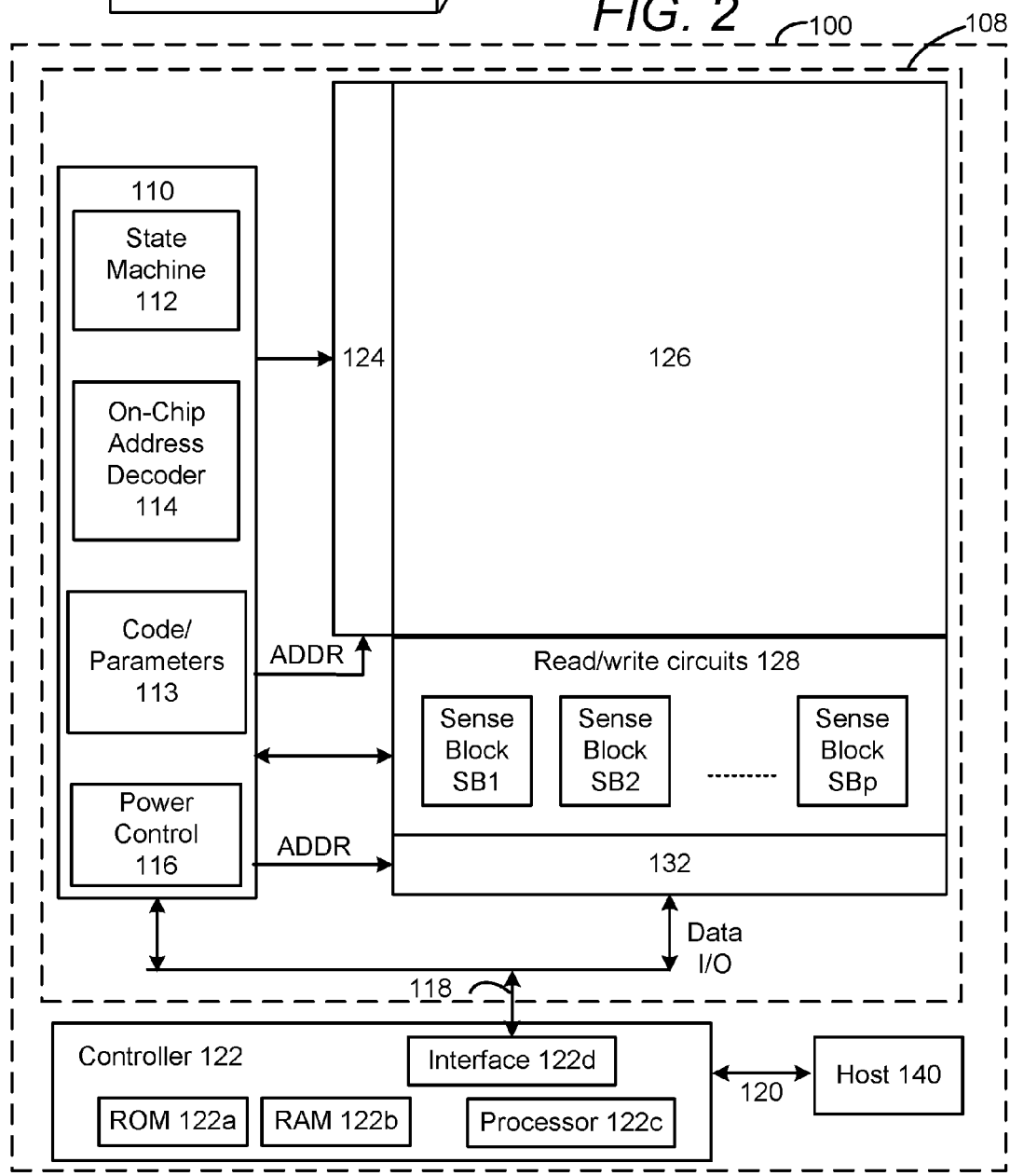

FIG. 4D
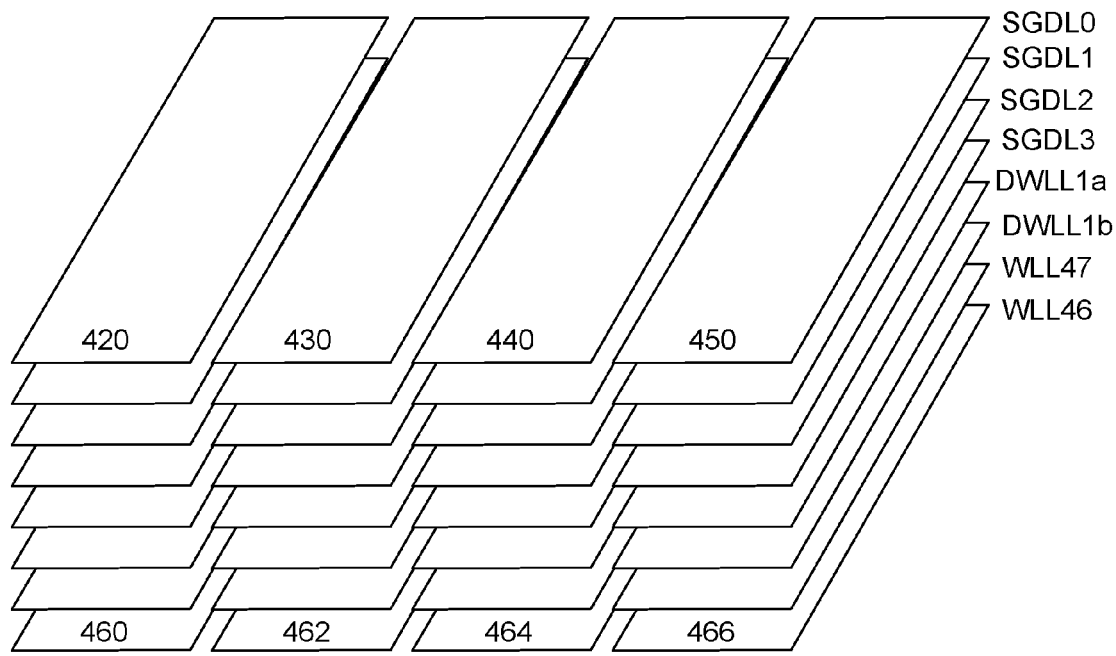
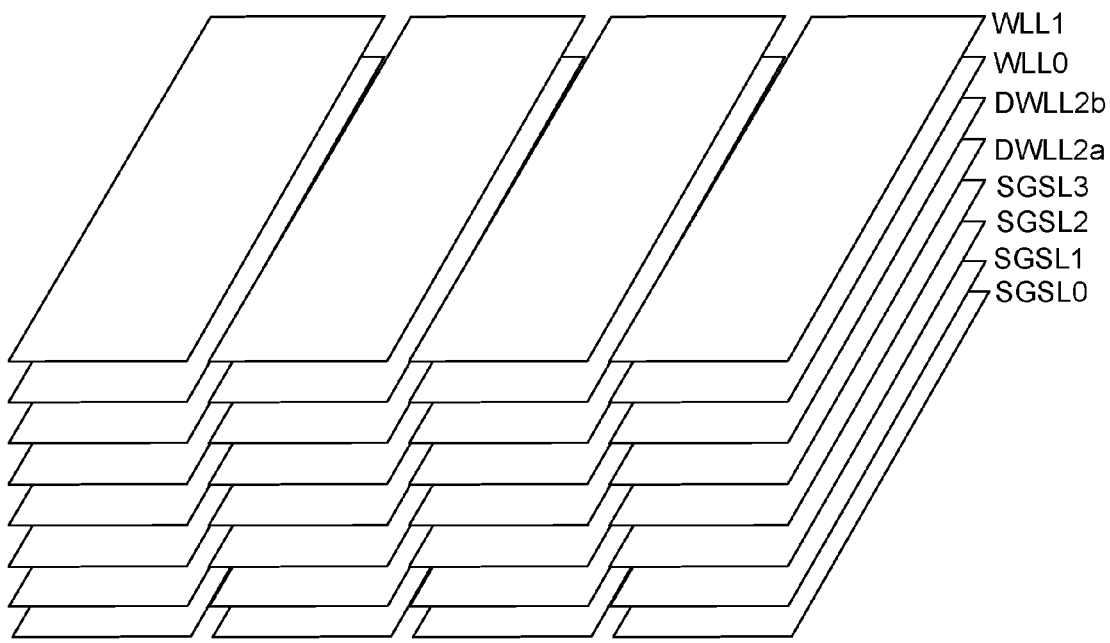

|  | S0 | S1 | S2 | S3 | S4 | S5 | S6 | S7 |
|---|---|---|---|---|---|---|---|---|
| Upper Page | 1 | 1 | 1 | 0 | 0 | 0 | 0 | 1 |
| Middle Page | 1 | 1 | 0 | 0 | 1 | 1 | 0 | 0 |
| Lower Page | 1 | 0 | 0 | 0 | 0 | 1 | 1 | 1 |

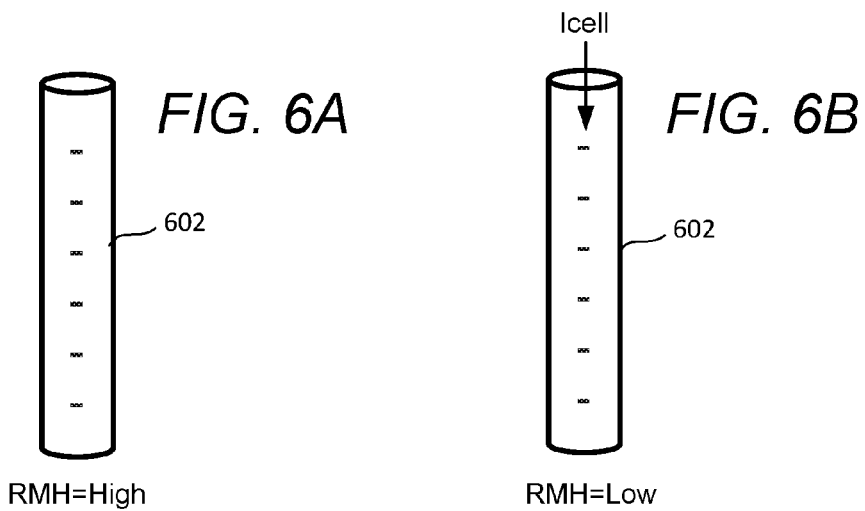
FIG. 6A  RMH=High
FIG. 6B  RMH=Low
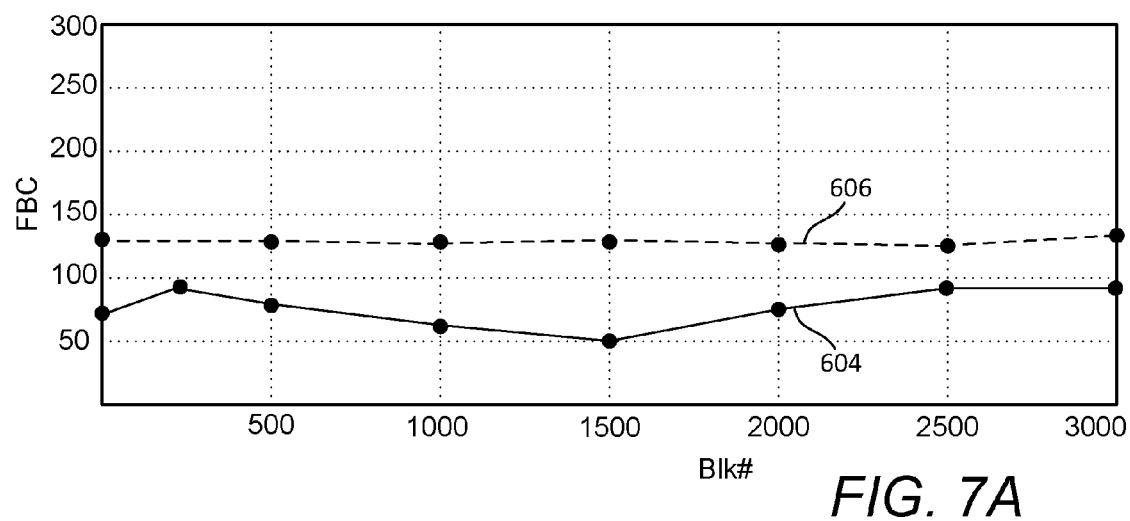
FIG. 7A
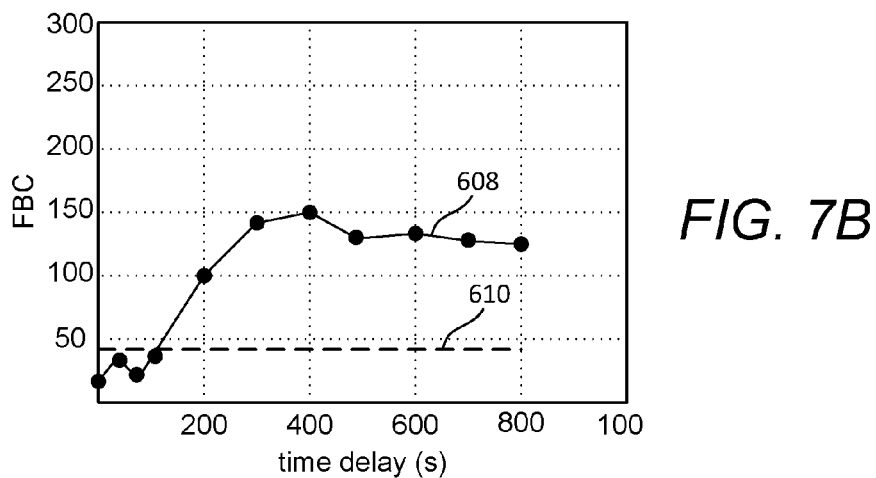
FIG. 7B

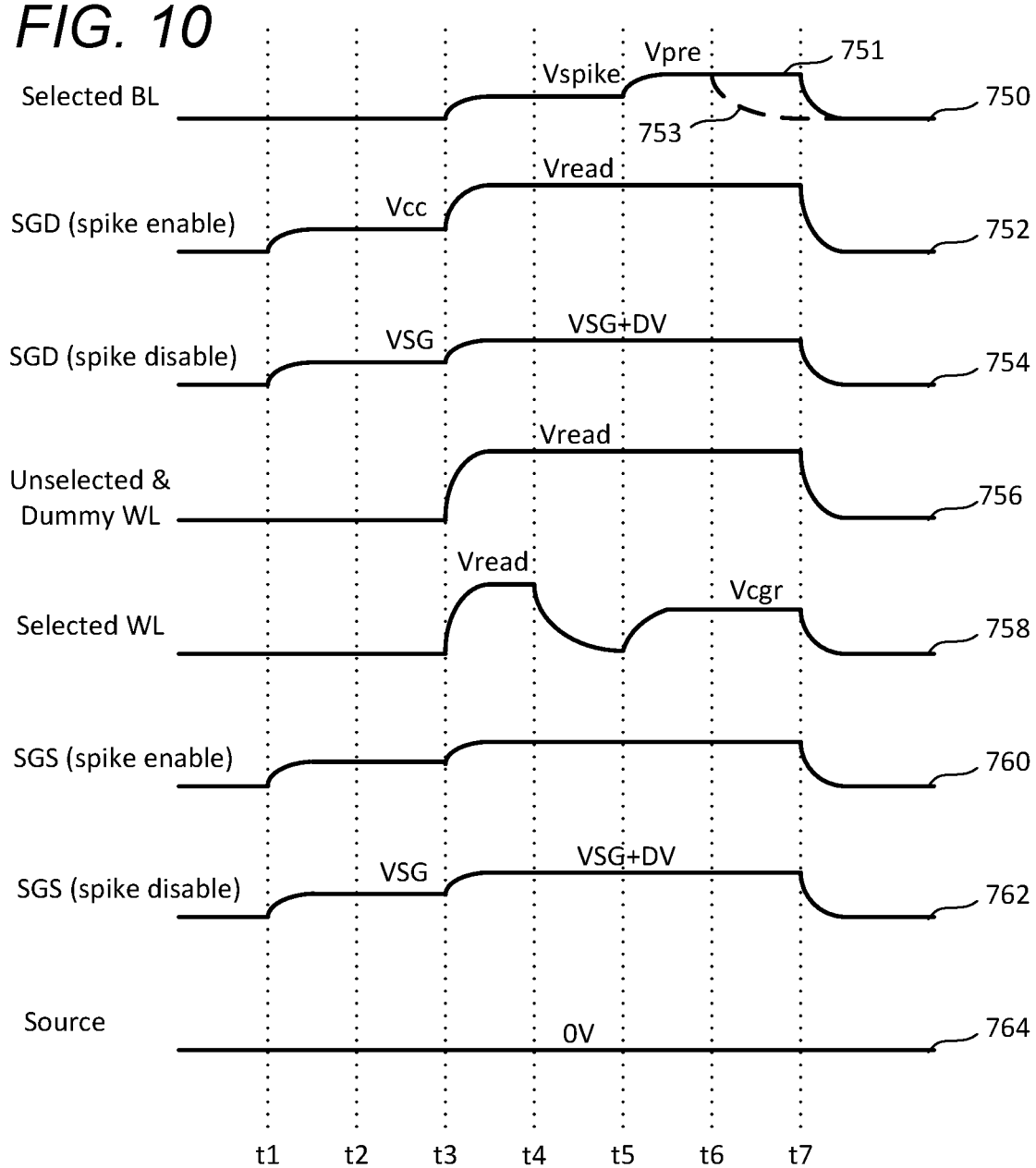

APPARATUS AND METHOD FOR PRECONDITIONING CURRENTS TO REDUCE ERRORS IN SENSING FOR NON-VOLATILE MEMORY

BACKGROUND OF THE INVENTION

Semiconductor memory devices have become more popular for use in various electronic devices. For example, non-volatile semiconductor memory is used in cellular telephones, digital cameras, personal digital assistants, mobile computing devices, non-mobile computing devices and other devices. Flash memory is among the most popular non-volatile semiconductor memories.

Some non-volatile memory devices are used to store two ranges of charges and, therefore, the memory cells can be programmed/erased between two data states: an erased state and a programmed state (corresponding to data "1" and data "0"). Such a device is referred to as a binary device or a single-level cell (SLC) and the data is binary data.

A multi-state flash memory cell (storing multi-state data) is implemented by identifying multiple, distinct allowed threshold voltage ranges (ie data states). Each distinct threshold voltage range corresponds to a predetermined value for the set of data bits. For example, some memory cells can store two bits, and others can store three bits. The specific relationship between the data programmed into the memory cell and the threshold voltage ranges (also called data states) of the memory cell depends upon the data encoding scheme adopted for the memory cells. For example, U.S. Pat. No. 6,222,762 and U.S. Patent Application Publication No. 2004/0255090, both describe various data encoding schemes for multi-state flash memory cells.

In addition to the gains in capacity resulting from multi-state memory architectures, consumers have seen significant advantages as a result of a history of steadily scaling down the physical dimensions of memory cells. Smaller memory cells can be packed more densely on a given die area, allowing the user to access more memory capacity for the same price as an older memory technology. In order to achieve the advantage of higher memory capacity for a fixed die size, these smaller memory cells must be packed more closely together. Doing so, however, may result in a greater number of operational errors, such as errors when programming data to the memory and/or reading back user data from the memory. The errors may result in increased processing times to recover the data, or in some instances a corruption of data that has been stored.

Prior systems have sought to combat read and programming errors by providing various compensations or other techniques to improve data reliability. Nevertheless, errors associated with programming and reading may continue to be seen.

SUMMARY

One embodiment includes an apparatus that comprises a plurality of non-volatile memory cells, a pre-sense circuit configured to generate a first current in a channel of the non-volatile memory cells for a predefined duration in response to a first sense operation, and a sense circuit configured to sense a selected non-volatile memory cell of the plurality in response to the first sense operation.

One embodiment includes an apparatus that comprises a plurality of nonvolatile memory cells, a current generation circuit configured to generate at least a first preconditioning current through the plurality of non-volatile memory cells in association with a first sense operation, and a read circuit configured to apply a reference voltage to a selected non-volatile memory cell to execute the first sense operation after the current generation circuit generates the at least a first preconditioning current.

One embodiment includes a method that comprises receiving a request to read data from at least one of a group of memory cells, applying to a bit line of the group of memory cells a positive bit line voltage while providing a conduction path through the group of memory cells in response to the read request, applying to a selected non-volatile memory cell of the group at least one of a series of read reference voltages after applying the positive bit line voltage, and determining data for the selected memory cell based on applying the at least one of a series of read reference voltages.

One embodiment includes an apparatus that comprises a bit line, a plurality of word lines, a group of non-volatile memory cells coupled to the bit line and the plurality of word lines, means for generating in association with a first read operation at least a first current from the bit line through the group of non-volatile memory cells, and means for applying to a selected word line at least one of a plurality of read reference voltages in association with the first read operation after generating the at least a first current.

BRIEF DESCRIPTION OF THE DRAWINGS

FIG. 1 is a perspective view of a 3D stacked non-volatile memory device.

FIG. 2 is a functional block diagram of a memory device such as the 3D stacked non-volatile memory device 100 of FIG. 1.

FIG. 4D depicts a view of the select gate layers and word line layers.

FIGS. 6A-6B are simplified views of a memory hole showing a channel resistance before and after a verification operation in one embodiment.

FIG. 7A is a chart illustrating the fail bit count for different blocks of a non-volatile memory array after a first and second read operation in one embodiment.

FIG. 7B is a chart illustrating the fail bit count for a group of memory cells as a function of the time delay between a first read operation and a second read operation for the group in one embodiment.

FIG. 10 is a timing diagram depicting various waveforms that may be generated as part of a read operation in one embodiment.

DETAILED DESCRIPTION

Figure 3:
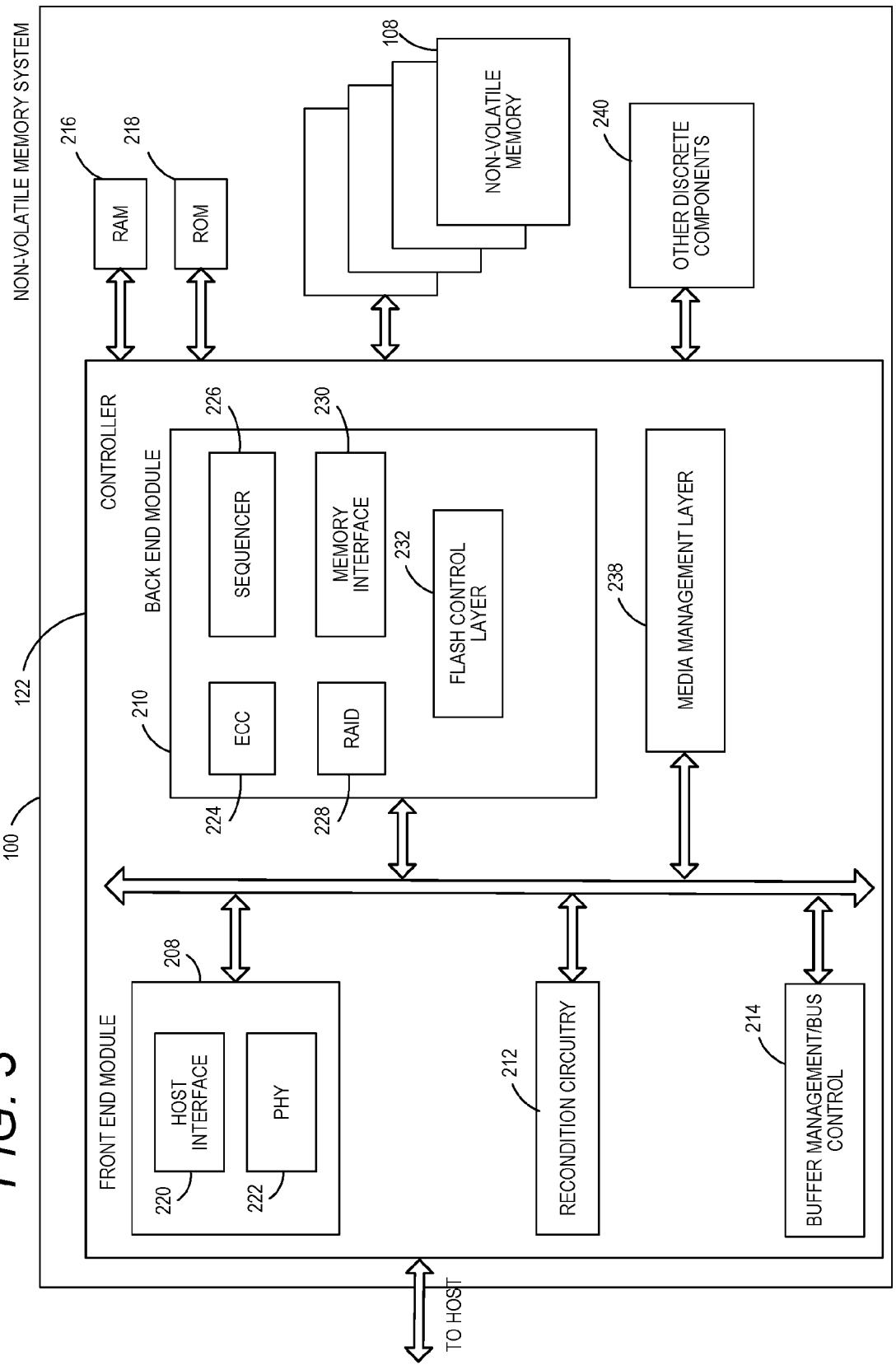
FIG. 3 is a block diagram depicting one embodiment of a controller.

The disclosed technology is directed to reducing errors when reading or verifying non-volatile memory. A preconditioning current is applied for a group of memory cells as part of a read or verify operation for a selected memory cell of the group. In one embodiment, a preconditioning current is passed through the group of memory cells for a predetermined duration. The preconditioning current passes through the memory cells, entering the group of memory cells on one side and exiting on the other. The current can be passed through a shared region of the group of memory cells including a selected memory cell for reading. The preconditioning current is a current spike applied as part of a sense operation in one embodiment. The current spike is provided prior to applying at least one reference voltage such as a read or verify voltage to a selected word line connected to the selected memory cells.

The current spike can mimic or otherwise simulate a cell current that passes through the channel during a verification phase of programming. The preconditioning current can modify the channel by reducing its resistance to approximate a condition during verification. In this manner, the threshold voltage of the selected memory cell may appear more stable in an effort to reduce read errors that lead to increases in the fail bit count associated with memory pages. The memory array may comprise a NAND memory array (e.g., a vertical NAND memory including vertical NAND strings) that includes a NAND string.

During program verification, a cell current may cause electron trapping within a shared region of a group of memory cells. For example, the cell current may result in electrons accumulating in the polysilicon channel of a vertical NAND string formed over a substrate. Such an accumulation may lead to an increase in the apparent threshold voltage of the memory cells of the NAND string. The accumulated electrons may decrease the channel resistance, resulting in an apparent decrease in threshold voltage. Over time, these electrons may detrap or recombine. This can result in an increase in the channel resistance and consequently the apparent threshold voltage of the associated memory cells. Accordingly, the disclosed preconditioning current is applied prior to sensing in an effort to simulate the effects of the cell current during verification. In this manner, the apparent threshold voltage observed during sensing may better approximate the threshold voltage observed during verification.

In one embodiment, one or more control circuits in communication with a memory array receive a command and identify memory cells associated with a page of data to be read or memory cells associated with a verify operation (e.g., determined based on a address provided to the control circuitry). The memory cells may be connected to a selected word line and associated with one or more pages of data. The system may identify a number of selected NAND strings for sensing from the selected word line. Each NAND string contains at least one memory cell connected to the selected word line to be sensed. The control circuits determine whether to apply a preconditioning current such as a current spike through the selected NAND strings. If the preconditioning current is to be applied, the system biases the memory array to generate the preconditioning current in the selected NAND strings. After applying the preconditioning current, the system applies one or more reference voltages to sense the threshold voltage of the selected memory cells. A preconditioning current may be applied before sensing at each read reference voltage in a series of read reference voltages for a page of data, or only for select voltages such as the first read reference voltage in the series.

Various techniques are provided to improve performance and reduce power consumption that may be associated with a preconditioning current. For example, detrapping of electrons from the channel region may be expected to occur over a time period. In this manner, it may be possible to limit the use of a preconditioning current to instances where it can be expected that the detrapping may result in an erroneous read. In one embodiment, the system applies a preconditioning current for a group of memory cells for a first read operation associated with a selected word line, but does not apply the preconditioning current before a second read operation or other read operation following the first read operation. The cell current generated during the first read operation may result in electron trapping such that an additional preconditioning current is not needed. In another example, the preconditioning current is only applied for the first read operation if a sufficient time delay has occurred since programming or reading from the selected word line.

Additional factors including temperature may be used to determine whether to generate a preconditioning current before a sense operation. It has been observed that electron detrapping is more likely to occur at lower temperatures. Accordingly, a preconditioning current is applied selectively before a sense operation based on temperature in one embodiment. At higher temperatures, the preconditioning current may not be needed and can be omitted to conserve power and improve performance. In another example, temperature may be used to adjust the size and/or the duration of a preconditioning current.

FIG. 1 is a perspective view of an example of a three dimensional (3D) stacked non-volatile memory device. The memory device 100 includes a substrate 101. On and above the substrate are example blocks BLK0 and BLK1 of memory cells (non-volatile storage elements). Also on substrate 101 is peripheral area 104 with support circuits for use by the blocks. Substrate 101 can also carry circuits under the blocks, along with one or more lower metal layers which are patterned in conductive paths to carry signals of the circuits. The blocks are formed in an intermediate region 102 of the memory device. In an upper region 103 of the memory device, one or more upper metal layers are patterned in conductive paths to carry signals of the circuits. Each block comprises a stacked area of memory cells, where alternating levels of the stack represent word lines. While two blocks are depicted as an example, additional blocks can be used, extending in the x- and/or y-directions.

In one example implementation, the length of the plane in the x-direction, represents a direction in which signal paths for word lines extend (a word line or SGD line direction), and the width of the plane in the y-direction, represents a direction in which signal paths for bit lines extend (a bit line direction). The z-direction represents a height of the memory device.

FIG. 2 is a functional block diagram of an example memory device such as the 3D stacked non-volatile memory device 100 of FIG. 1. The components depicted in FIG. 2 are electrical circuits. Memory device 100 includes one or more memory die 108. Each memory die 108 includes a three dimensional memory structure 126 of memory cells (such as, for example, a 3D array of memory cells), control circuitry 110, and read/write circuits 128. In other embodiments, a two dimensional array of memory cells can be used. Memory structure 126 is addressable by word lines via a row decoder 124 and by bit lines via a column decoder 132. The read/write circuits 128 include multiple sense blocks SB1, SB2, . . . , SBp (sensing circuitry) and allow a page of memory cells to be read or programmed in parallel. In some systems, a controller 122 is included in the same memory device 100 (e.g., a removable storage card) as the one or more memory die 108. However, in other systems, the controller can be separated from the memory die 108. In some embodiments the controller will be on a different die than the memory die. In some embodiments, one controller 122 will communicate with multiple memory die 108. In other embodiments, each memory die 108 has its own controller. Commands and data are transferred between the host 140 and controller 122 via a data bus 120, and between controller 122 and the one or more memory die 108 via lines 118. In one embodiment, memory die 108 includes a set of input and/or output (I/O) pins that connect to lines 118.

Memory structure 126 may comprise one or more arrays of memory cells including a 3D array. The memory structure may comprise a monolithic three dimensional memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

Control circuitry 110 cooperates with the read/write circuits 128 to perform memory operations (e.g., erase, program, read, and others) on memory structure 126, and includes a state machine 112, an on-chip address decoder 114, and a power control module 116. The state machine 112 provides chip-level control of memory operations. Code and parameter storage 113 may be provided for storing operational parameters and software. In one embodiment, state machine 112 is programmable by the software stored in code and parameter storage 113. In other embodiments, state machine 112 does not use software and is completely implemented in hardware (e.g., electrical circuits).

The on-chip address decoder 114 provides an address interface between addresses used by host 140 or memory controller 122 to the hardware address used by the decoders 124 and 132. Power control module 116 controls the power and voltages supplied to the word lines and bit lines during memory operations. It can include drivers for word line layers (discussed below) in a 3D configuration, select transistors (e.g., SGS and SGD transistors, described below) and source lines. Power control module 116 may include charge pumps for creating voltages. The sense blocks include bit line drivers. An SGS transistor is a select gate transistor at a source end of a NAND string, and an SGD transistor is a select gate transistor at a drain end of a NAND string.

Any one or any combination of control circuitry 110, state machine 112, decoders 114/124/132, code and parameter storage 113, power control module 116, sense blocks SB1, SB2, . . . , SBp, read/write circuits 128, and controller 122 can be considered one or more control circuits that performs the functions described herein.

The (on-chip or off-chip) controller 122 may comprise a processor 122c, ROM 122a, RAM 122b and a Memory Interface 122d. The storage devices (ROM 122a, RAM 122b) comprises code such as a set of instructions, and the processor 122c is operable to execute the set of instructions to provide the functionality described herein. Alternatively or additionally, processor 122c can access code from a storage device in the memory structure, such as a reserved area of memory cells connected to one or more word lines. Memory interface 122d, in communication with ROM 122a, RAM 122b and processor 122c, is an electrical circuit that provides an electrical interface between controller 122 and memory die 108. For example, memory interface 122d can change the format or timing of signals, provide a buffer, isolate from surges, latch I/O, etc.

Multiple memory elements in memory structure 126 may be configured so that they are connected in series or so that each element is individually accessible. By way of non-limiting example, flash memory devices in a NAND configuration (NAND flash memory) typically contain memory elements connected in series. A NAND string is an example of a set of series-connected memory cells and select gate transistors.

A NAND flash memory array may be configured so that the array is composed of multiple NAND strings of which a NAND string is composed of multiple memory cells sharing a single bit line and accessed as a group. Alternatively, memory elements may be configured so that each element is individually accessible, e.g., a NOR memory array. NAND and NOR memory configurations are exemplary, and memory cells may be otherwise configured.

The memory cells may be arranged in the single memory device level in an ordered array, such as in a plurality of rows and/or columns. However, the memory elements may be arrayed in non-regular or non-orthogonal configurations, or in structures not considered arrays.

A three dimensional memory array is arranged so that memory cells occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory cells. The vertical columns may be arranged in a two dimensional configuration, e.g., in an x-y plane, resulting in a three dimensional arrangement of memory cells, with memory cells on multiple vertically stacked memory planes. Other configurations of memory elements in three dimensions can also constitute a three dimensional memory array.

By way of non-limiting example, in a three dimensional NAND memory array, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

A person of ordinary skill in the art will recognize that the technology described herein is not limited to a single specific memory structure, but covers many relevant memory structures within the spirit and scope of the technology as described herein and as understood by one of ordinary skill in the art.

FIG. 3 is a block diagram of example memory system 100, depicting more details of controller 122. As used herein, a flash memory controller is a device that manages data stored on flash memory and communicates with a host, such as a computer or electronic device. A flash memory controller can have various functionality in addition to the specific functionality described herein. For example, the flash memory controller can format the flash memory to ensure the memory is operating properly, map out bad flash memory cells, and allocate spare memory cells to be substituted for future failed cells. Some part of the spare cells can be used to hold firmware to operate the flash memory controller and implement other features. In operation, when a host needs to read data from or write data to the flash memory, it will communicate with the flash memory controller. If the host provides a logical address to which data is to be read/written, the flash memory controller can convert the logical address received from the host to a physical address in the flash memory. (Alternatively, the host can provide the physical address). The flash memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The interface between controller 122 and non-volatile memory die 104 may be any suitable flash interface, such as Toggle Mode 200, 400, or 800. In one embodiment, memory system 100 may be a card based system, such as a secure digital (SD) or a micro secure digital (micro-SD) card. In an alternate embodiment, memory system 100 may be part of an embedded memory system. For example, the flash memory may be embedded within the host, such as in the form of a solid state disk (SSD) drive installed in a personal computer.

In some embodiments, non-volatile memory system 100 includes a single channel between controller 122 and non-volatile memory die 108, the subject matter described herein is not limited to having a single memory channel. For example, in some memory system architectures, 2, 4, 8 or more channels may exist between the controller and the memory die, depending on controller capabilities. In any of the embodiments described herein, more than a single channel may exist between the controller and the memory die, even if a single channel is shown in the drawings.

As depicted in FIG. 3, controller 112 includes a front end module 208 that interfaces with a host, a back end module 210 that interfaces with the one or more non-volatile memory die 108, and various other modules that perform functions which will now be described in detail.

The components of controller 122 depicted in FIG. 3 may take the form of a packaged functional hardware unit (e.g., an electrical circuit) designed for use with other components, a portion of a program code (e.g., software or firmware) executable by a (micro)processor or processing circuitry that usually performs a particular function of related functions, or a self-contained hardware or software component that interfaces with a larger system, for example. For example, each module may include an application specific integrated circuit (ASIC), a Field Programmable Gate Array (FPGA), a circuit, a digital logic circuit, an analog circuit, a combination of discrete circuits, gates, or any other type of hardware or combination thereof. Alternatively or in addition, each module may include software stored in a processor readable device (e.g., memory) to program a processor for controller 122 to perform the functions described herein. The architecture depicted in FIG. 3 is one example implementation that may (or may not) use the components of controller 122 depicted in FIG. 2 (ie RAM, ROM, processor, interface).

Controller 122 may include recondition circuitry 212, which is used for reconditioning memory cells or blocks of memory. The reconditioning may include refreshing data in its current location or reprogramming data into a new word line or block as part of performing word line maintenance, as described herein.

Referring again to modules of the controller 122, a buffer manager/bus controller 214 manages buffers in random access memory (RAM) 216 and controls the internal bus arbitration of controller 122. A read only memory (ROM) 218 stores system boot code. Although illustrated in FIG. 3 as located separately from the controller 122, in other embodiments one or both of the RAM 216 and ROM 218 may be located within the controller. In yet other embodiments, portions of RAM and ROM may be located both within the controller 122 and outside the controller. Further, in some implementations, the controller 122, RAM 216, and ROM 218 may be located on separate semiconductor die.

Front end module 208 includes a host interface 220 and a physical layer interface (PHY) 222 that provide the electrical interface with the host or next level storage controller. The choice of the type of host interface 220 can depend on the type of memory being used. Examples of host interfaces 220 include, but are not limited to, SATA, SATA Express, SAS, Fibre Channel, USB, PCIe, and NVMe. The host interface 220 typically facilitates transfer for data, control signals, and timing signals.

Back end module 210 includes an error correction controller (ECC) engine 224 that encodes the data bytes received from the host, and decodes and error corrects the data bytes read from the non-volatile memory. A command sequencer 226 generates command sequences, such as program and erase command sequences, to be transmitted to non-volatile memory die 108. A RAID (Redundant Array of Independent Drives) module 228 manages generation of RAID parity and recovery of failed data. The RAID parity may be used as an additional level of integrity protection for the data being written into the non-volatile memory system 100. In some cases, the RAID module 228 may be a part of the ECC engine 224. A memory interface 230 provides the command sequences to non-volatile memory die 108 and receives status information from non-volatile memory die 108. In one embodiment, memory interface 230 may be a double data rate (DDR) interface, such as a Toggle Mode 200, 400, or 800 interface. A flash control layer 232 controls the overall operation of back end module 210.

Additional components of system 100 illustrated in FIG. 3 include media management layer 238, which performs wear leveling of memory cells of non-volatile memory die 108. System 100 also includes other discrete components 240, such as external electrical interfaces, external RAM, resistors, capacitors, or other components that may interface with controller 122. In alternative embodiments, one or more of the physical layer interface 222, RAID module 228, media management layer 238 and buffer management/bus controller 214 are optional components that are not necessary in the controller 122.

The FTL or MML 238 may be integrated as part of the flash management that may handle flash errors and interfacing with the host. In particular, MML may be a module in flash management and may be responsible for the internals of NAND management. In particular, the MML 238 may include an algorithm in the memory device firmware which translates writes from the host into writes to the flash memory 126 of die 108. The MML 238 may be needed because: 1) the flash memory may have limited endurance; 2) the flash memory 126 may only be written in multiples of pages; and/or 3) the flash memory 126 may not be written unless it is erased as a block. The MML 238 understands these potential limitations of the flash memory 126 which may not be visible to the host. Accordingly, the MML 238 attempts to translate the writes from host into writes into the flash memory 126. As described below, erratic bits may be identified and recorded using the MML 238. This recording of erratic bits can be used for evaluating the health of blocks and/or word lines (the memory cells on the word lines).

Figure 4A:
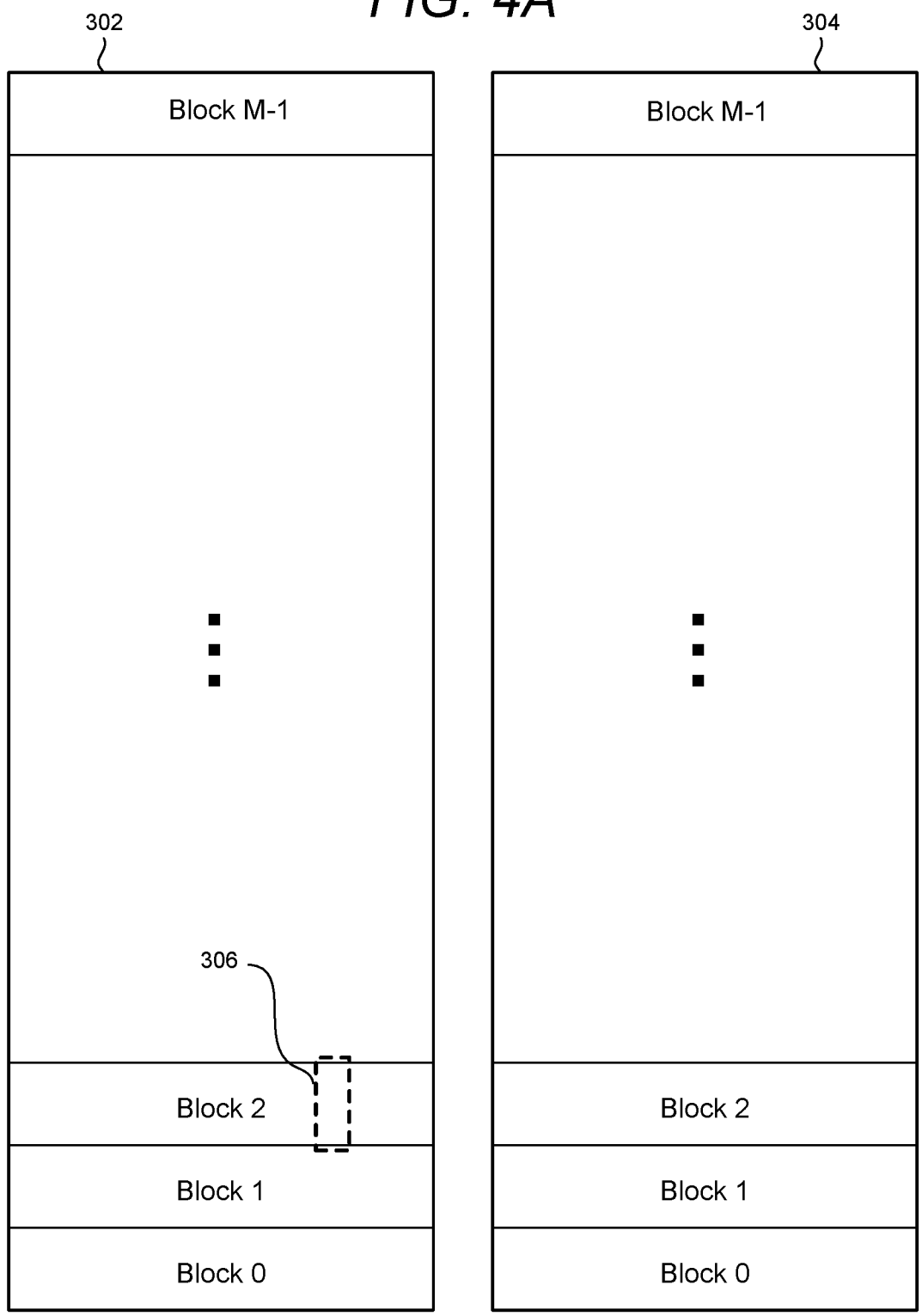
FIG. 4A is a block diagram of a memory structure having two planes.

FIG. 4A is a block diagram explaining one example organization of memory structure 126, which is divided into two planes 302 and 304. Each plane is then divided into M blocks. In one example, each plane has about 2000 blocks. However, different numbers of blocks and planes can also be used. For example, some systems may have more than two planes. Other systems may only have one plane.

Figure 4B:
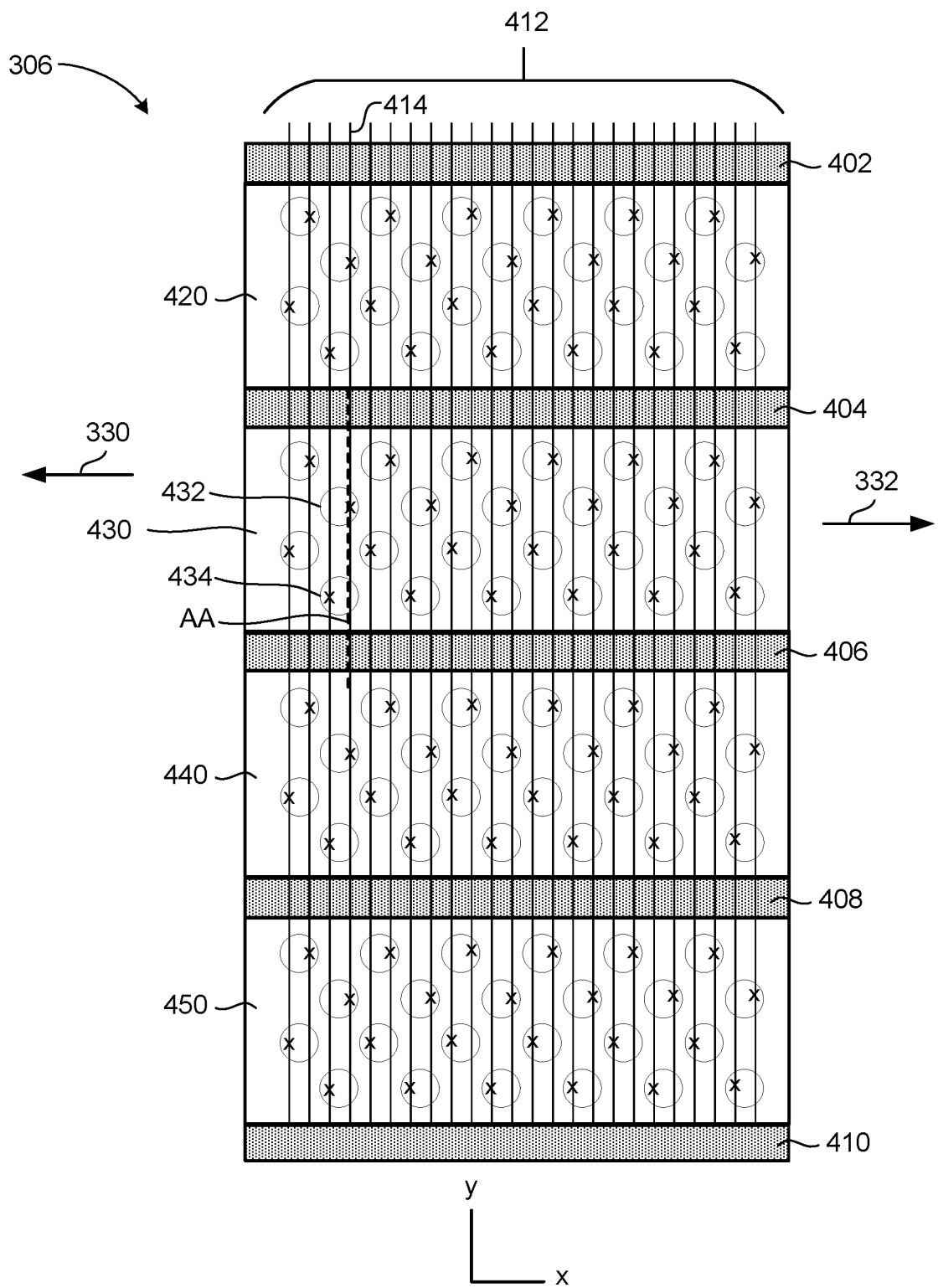
FIG. 4B depicts a top view of a portion of a block of memory cells.

FIGS. 4B-4E depict an example 3D NAND structure. FIG. 4B is a block diagram depicting a top view of a portion of one block from memory structure 126. The portion of the block depicted in FIG. 4B corresponds to portion 306 in block 2 of FIG. 4A. As can be seen from FIG. 4B, the block depicted in FIG. 4B extends in the direction of arrow 330 and in the direction of arrow 332. In one embodiment, the memory array will have 60 layers. Other embodiments have less than or more than 60 layers. However, FIG. 4B only shows the top layer.

FIG. 4B depicts a plurality of circles that represent the vertical columns. Each of the vertical columns include multiple select transistors and multiple memory cells. In one embodiment, each vertical column implements a NAND string. More details of the vertical columns are provided below. Since the block depicted in FIG. 4B extends in the direction of arrow 330 and in the direction of arrow 332, the block includes more vertical columns than depicted in FIG. 4B FIG. 4B also depicts a set of bit lines 412. FIG. 4B shows twenty four bit lines because only a portion of the block is depicted. It is contemplated that more than twenty four bit lines connected to vertical columns of the block. Each of the circles representing vertical columns has an "x" to indicate its connection to one bit line.

The block depicted in FIG. 4B includes a set of local interconnects 402, 404, 406, 408 and 410 that connect the various layers to a source line below the vertical columns. Local interconnects 402, 404, 406, 408 and 410 also serve to divide each layer of the block into four regions; for example, the top layer depicted in FIG. 4B is divided into regions 420, 430, 440 and 450, which are referred to as fingers. In the layers of the block that implement memory cells, the four regions are referred to as word line fingers that are separated by the local interconnects. In one embodiment, the word line fingers on a common level of a block connect together at the end of the block to form a single word line. In another embodiment, the word line fingers on the same level are not connected together. In one example implementation, a bit line only connects to one vertical column in each of regions 420, 430, 440 and 450. In that implementation, each block has sixteen rows of active columns and each bit line connects to four rows in each block. In one embodiment, all of four rows connected to a common bit line are connected to the same word line (via different word line fingers on the same level that are connected together); therefore, the system uses the source side select lines and the drain side select lines to choose one (or another subset) of the four to be subjected to a memory operation (program, verify, read, and/or erase).

Although FIG. 4B shows each region having four rows of vertical columns, four regions and sixteen rows of vertical columns in a block, those exact numbers are an example implementation. Other embodiments may include more or less regions per block, more or less rows of vertical columns per region and more or less rows of vertical columns per block.

FIG. 4B also shows the vertical columns being staggered. In other embodiments, different patterns of staggering can be used. In some embodiments, the vertical columns are not staggered.

Figure 4C:
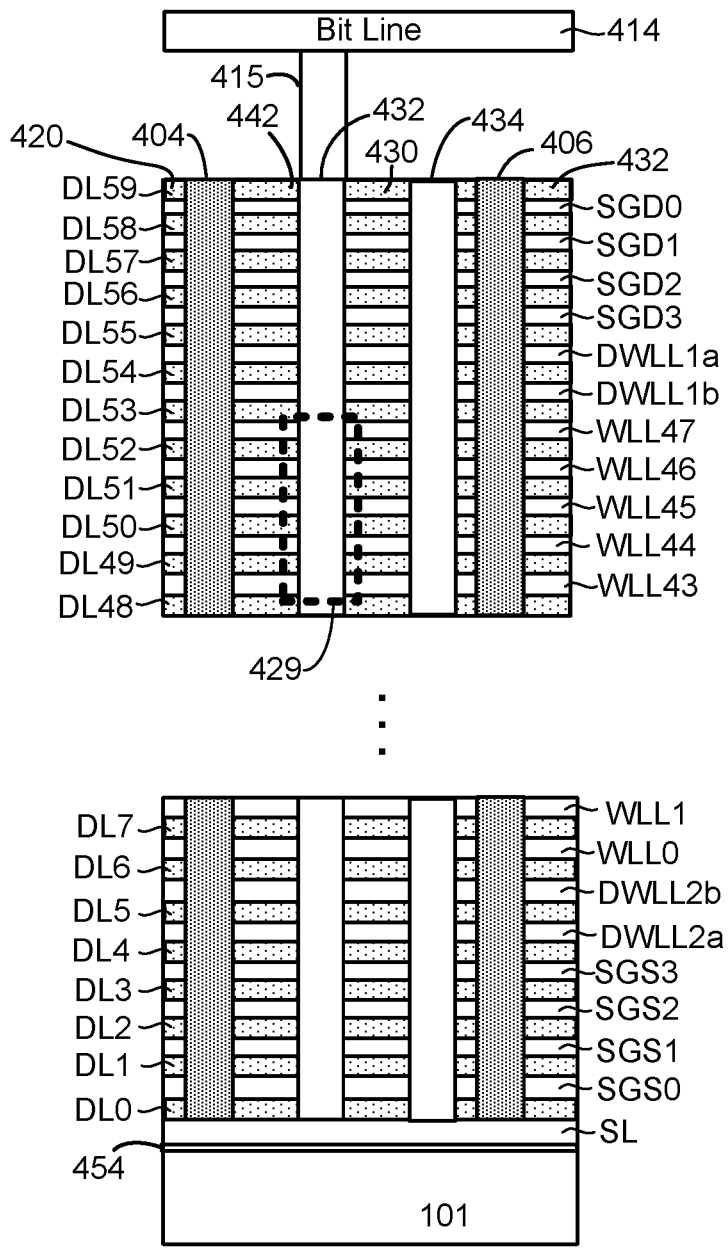
FIG. 4C depicts a cross sectional view of a portion of a block of memory cells.

FIG. 4C depicts a portion of an embodiment of three dimensional memory structure 126 showing a cross-sectional view along line AA of FIG. 4B. This cross sectional view cuts through vertical columns 432 and 434 and region 430 (see FIG. 4B). The structure of FIG. 4C includes four drain side select layers SGD0, SGD1, SGD2 and SGD3; four source side select layers SGS0, SGS1, SGS2 and SGS3; four dummy word line layers DWLL1a, DWLL1b, DWLL2a and DWLL2b; and forty eight data word line layers WLL0-WLL47 for connecting to data memory cells. Other embodiments can implement more or less than four drain side select layers, more or less than four source side select layers, more or less than four dummy word line layers, and more or less than forty eight word line layers. Vertical columns 432 and 434 are depicted protruding through the drain side select layers, source side select layers, dummy word line layers and word line layers. In one embodiment, each vertical column comprises a NAND string. Below the vertical columns and the layers listed below is substrate 101, an insulating film 454 on the substrate, and source line SL. The NAND string of vertical column 432 has a source end at a bottom of the stack and a drain end at a top of the stack. As in agreement with FIG. 4B, FIG. 4C show vertical column 432 connected to Bit Line 414 via connector 415. Local interconnects 404 and 406 are also depicted.

For ease of reference, drain side select layers SGD0, SGD1, SGD2 and SGD3; source side select layers SGS0, SGS1, SGS2 and SGS3; dummy word line layers DWLL1a, DWLL1b, DWLL2a and DWLL2b; and word line layers WLL0-WLL47 collectively are referred to as the conductive layers. In one embodiment, the conductive layers are made from a combination of TiN and Tungsten. In other embodiments, other materials can be used to form the conductive layers, such as doped polysilicon, metal such as Tungsten or metal silicide. In some embodiments, different conductive layers can be formed from different materials. Between conductive layers are dielectric layers DL0-DL59. For example, dielectric layers DL49 is above word line layer WLL43 and below word line layer WLL44. In one embodiment, the dielectric layers are made from SiO2. In other embodiments, other dielectric materials can be used to form the dielectric layers.

The non-volatile memory cells are formed along vertical columns which extend through alternating conductive and dielectric layers in the stack. In one embodiment, the memory cells are arranged in NAND strings. The word line layer WLL0-WLL47 connect to memory cells (also called data memory cells). Dummy word line layers DWLL1a, DWLL1b, DWLL2a and DWLL2b connect to dummy memory cells. A dummy memory cell does not store user data, while a data memory cell is eligible to store user data. Drain side select layers SGD0, SGD1, SGD2 and SGD3 are used to electrically connect and disconnect NAND strings from bit lines. Source side select layers SGS0, SGS1, SGS2 and SGS3 are used to electrically connect and disconnect NAND strings from the source line SL.

FIG. 4D depicts a logical representation of the conductive layers (SGD0, SGD1, SGD2, SGD3, SGS0, SGS1, SGS2, SGS3, DWLL1a, DWLL1b, DWLL2a, DWLL2b, and WLL0-WLL47) for the block that is partially depicted in FIG. 4C. As mentioned above with respect to FIG. 4B, in one embodiment local interconnects 402, 404, 406, 408 and 410 break up each conductive layers into four regions. For example, word line layer WLL31 is divided into regions 460, 462, 464 and 466. For word line layers (WLL0-WLL31), the regions are referred to as word line fingers; for example, word line layer WLL46 is divided into word line fingers 460, 462, 464 and 466. In one embodiment, the four word line fingers on a same level are connected together. In another embodiment, each word line finger operates as a separate word line.

Drain side select gate layer SGD0 (the top layer) is also divided into regions 420, 430, 440 and 450, also known as fingers or select line fingers. In one embodiment, the four select line fingers on a same level are connected together. In another embodiment, each select line finger operates as a separate word line.

Figure 4E:
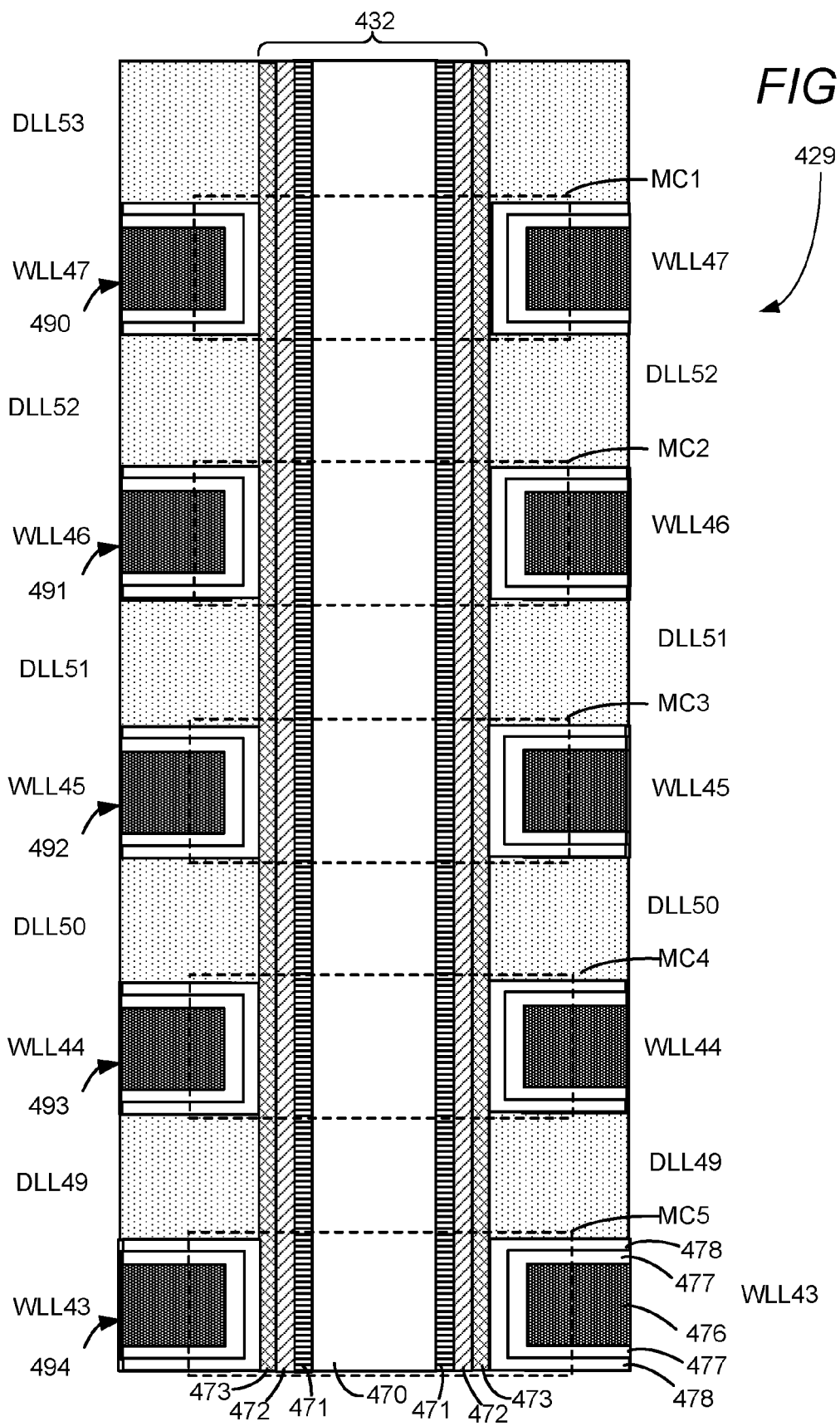
FIG. 4E is a cross sectional view of a vertical column of memory cells.

FIG. 4E depicts a cross sectional view of region 429 of FIG. 4C that includes a portion of vertical column 432. In one embodiment, the vertical columns are round and include four layers; however, in other embodiments more or less than four layers can be included and other shapes can be used. In one embodiment, vertical column 432 includes an inner core layer 470 that is made of a dielectric, such as SiO2. Other materials can also be used. Surrounding inner core 470 is polysilicon channel 471. Materials other than polysilicon can also be used. Note that it is the channel 471 that connects to the bit line. Surrounding channel 471 is a tunneling dielectric 472. In one embodiment, tunneling dielectric 472 has an ONO structure. Surrounding tunneling dielectric 472 is charge trapping layer 473, such as (for example) Silicon Nitride. Other memory materials and structures can also be used. The technology described herein is not limited to any particular material or structure.

FIG. 4E depicts dielectric layers DLL49, DLL50, DLL51, DLL52 and DLL53, as well as word line layers WLL43, WLL44, WLL45, WLL46, and WLL47. Each of the word line layers includes a word line region 476 surrounded by an aluminum oxide layer 477, which is surrounded by a blocking oxide (SiO2) layer 478. The physical interaction of the word line layers with the vertical column forms the memory cells. Thus, a memory cell, in one embodiment, comprises channel 471, tunneling dielectric 472, charge trapping layer 473, blocking oxide layer 478, aluminum oxide layer 477 and word line region 476. For example, word line layer WLL47 and a portion of vertical column 432 comprise a memory cell MC1. Word line layer WLL46 and a portion of vertical column 432 comprise a memory cell MC2. Word line layer WLL45 and a portion of vertical column 432 comprise a memory cell MC3. Word line layer WLL44 and a portion of vertical column 432 comprise a memory cell MC4. Word line layer WLL43 and a portion of vertical column 432 comprise a memory cell MC5. In other architectures, a memory cell may have a different structure; however, the memory cell would still be the storage unit.

When a memory cell is programmed, electrons are stored in a portion of the charge trapping layer 473 which is associated with the memory cell. These electrons are drawn into the charge trapping layer 473 from the channel 471, through the tunneling dielectric 472, in response to an appropriate voltage on word line region 476. The threshold voltage (Vth) of a memory cell is increased in proportion to the amount of stored charge. In one embodiment, the programming is achieved through Fowler-Nordheim tunneling of the electrons into the charge trapping layer. During an erase operation, the electrons return to the channel or holes are injected into the charge trapping layer to recombine with electrons. In one embodiment, erasing is achieved using hole injection into the charge trapping layer via a physical mechanism such as gate induced drain leakage (GIDL).

Figure 4F:
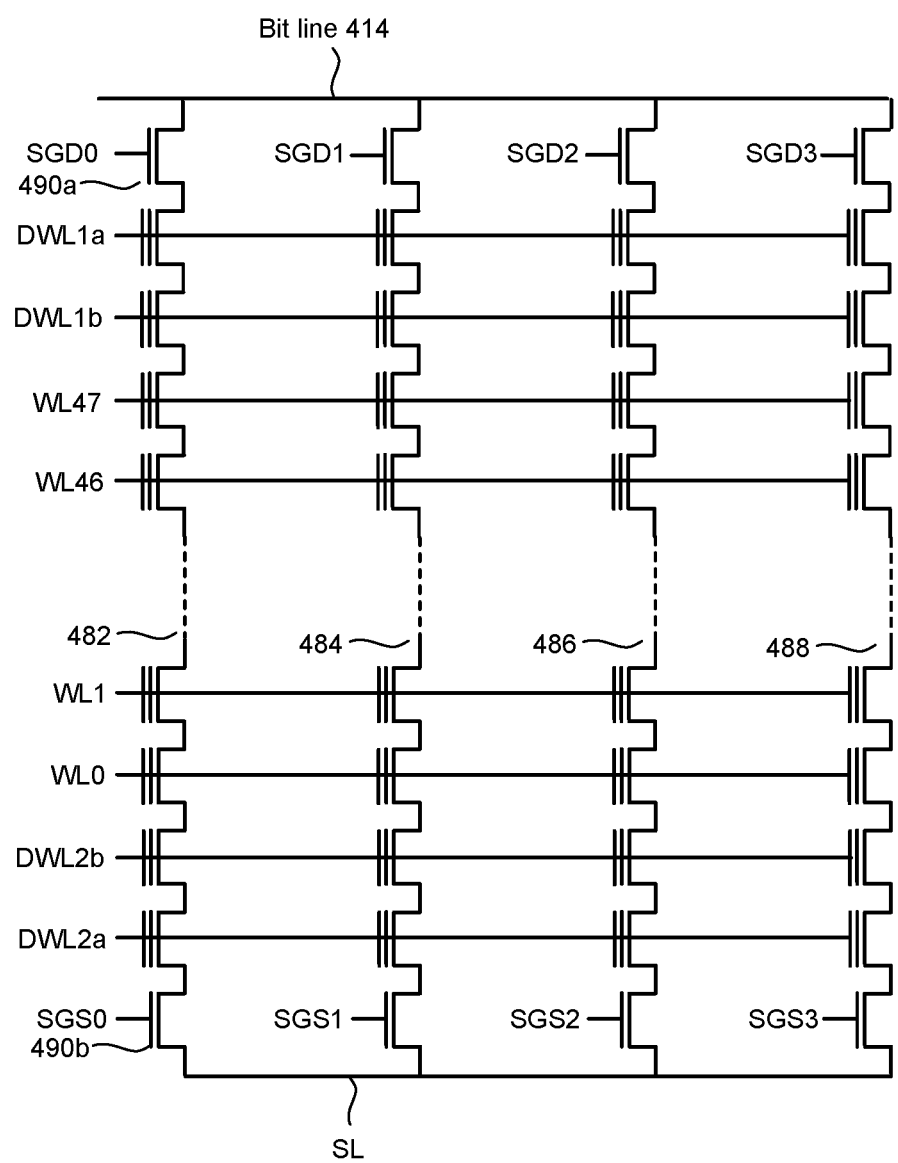
FIG. 4F is a schematic of a plurality of NAND strings.

FIG. 4F is a logical circuit diagram depicting a plurality of groups of connected programmable and erasable non-volatile memory cells arranged as four NAND strings 482, 484, 486 and 488 connected to bit line 414 and source line SL. The select lines SGD0, SGD1, SGD2, SGD3, SGS0, SGS1, SGS2, AND SGS3 are used to select/unselect the depicted NAND strings. In one embodiment all four drain side select lines (SGD0, SGD1, SGD2, SGD3) connect to each NAND string, but logically only one select line is used to select (actuate) each NAND strings. For example, SGD0 is used to select NAND string 482 to connect NAND string 482 to bit line 414, SGD1 is used to select NAND string 484 to connect NAND string 484 to bit line 414, SGD2 is used to select NAND string 486 to connect NAND string 486 to bit line 414, SGD3 is used to select NAND string 488 to connect NAND string 488 to bit line 414. Similarly, in one embodiment all four drain side select lines (SGS0, SGS1, SGS2, SGS3) connect to each NAND string, but logically only one select line is used to select (actuate) each NAND strings. For example, SGS0 is used to select NAND string 482 to connect NAND string 482 to common source line SL, SGS1 is used to select NAND string 484 to connect NAND string 484 to common source line SL, SGS2 is used to select NAND string 486 to connect NAND string 486 to common source line SL, SGS3 is used to select NAND string 488 to connect NAND string 488 to common source line SL. For example, to connect NAND string 482 to bit line 414, select gate 490b must be turned on (via select line SGD0) and to connect NAND string 482 to source line SL, select gate 490b must be turned on (via select line SGS0).

Although the example memory system discussed above is a three dimensional memory structure that includes vertical NAND strings with charge-trapping material, other (2D and 3D) memory structures can also be used with the technology described herein. For example, floating gate memories (e.g., NAND-type and NOR-type flash memory), ReRAM cross-point memories, magnetoresistive memory (e.g., MRAM), and phase change memory (e.g., PCRAM) can also be used.

One example of a ReRAM cross point memory includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. This configuration is known as a spin valve and is the simplest structure for an MRAM bit. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCRAM) exploits the unique behavior of chalcogenide glass. One embodiment uses a GeTe-Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. Note that the use of "pulse" in this document does not require a square pulse, but includes a (continuous or non-continuous) vibration or burst of sound, current, voltage light, or other wave.

Figures 5, 5F:
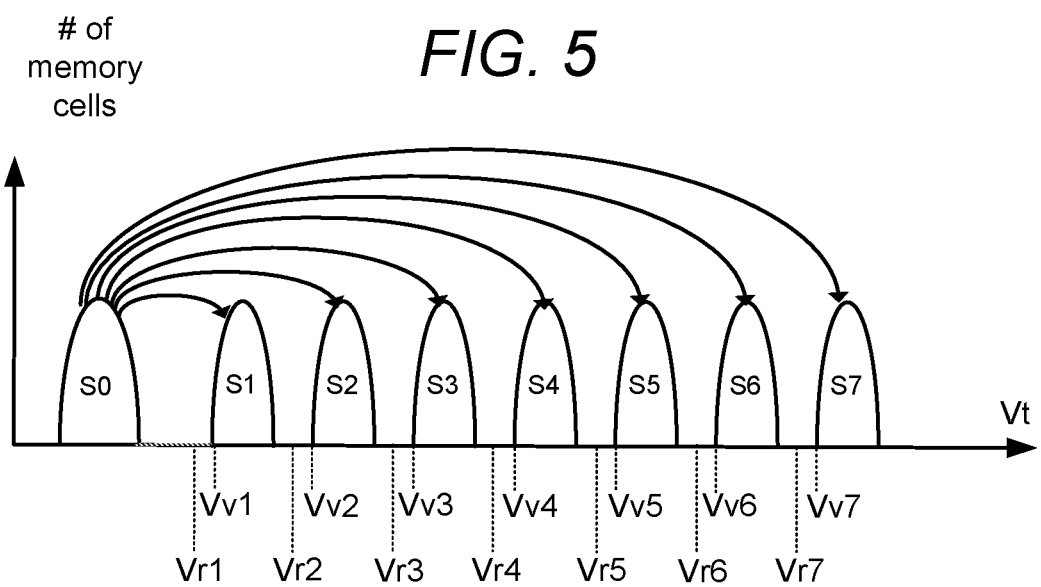
FIG. 5 depicts threshold voltage distributions.
FIG. 5F is a table depicting an example data encoding.

At the end of a successful programming process (with verification), the threshold voltages of the memory cells should be within one or more distributions of threshold voltages for programmed memory cells or within a distribution of threshold voltages for erased memory cells, as appropriate. FIG. 5 illustrates example threshold voltage distributions for the memory cell array when each memory cell stores three bits of data. Other embodiments, however, may use other data capacities per memory cell (e.g., such as one, two, four, or five bits of data per memory cell). FIG. 5 shows eight threshold voltage distributions, corresponding to eight data states. The first threshold voltage distribution (data state) S0 represents memory cells that are erased. The other seven threshold voltage distributions (data states) S1-S17 represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring physical state, only one bit will be affected. Adjacent data states are data states that are next to each other with respect to threshold voltage (or other attribute used to determine data value). For example, data states S3 and S4 are adjacent data states, and data states S6 and S7 are adjacent data states.

FIG. 5 also shows seven read reference voltages, Vr1, Vr2, Vr3, Vr4, Vr5, Vr6, and Vr7, for reading data from memory cells. By testing whether the threshold voltage of a given memory cell is above or below the seven read reference voltages, the system can determine what data state (i.e., S0, S1, S2, S3, . . . ) the memory cell is in.

FIG. 5 also shows seven verify reference voltages, Vv1, Vv2, Vv3, Vv4, Vv5, Vv6, and Vv7. When programming memory cells to data state S1, the system will test whether those memory cells have a threshold voltage greater than or equal to Vv1. When programming memory cells to data state S2, the system will test whether the memory cells have threshold voltages greater than or equal to Vv2. When programming memory cells to data state S3, the system will determine whether memory cells have their threshold voltage greater than or equal to Vv3. When programming memory cells to data state S4, the system will test whether those memory cells have a threshold voltage greater than or equal to Vv4. When programming memory cells to data state S5, the system will test whether those memory cells have a threshold voltage greater than or equal to Vv4. When programming memory cells to data state S6, the system will test whether those memory cells have a threshold voltage greater than or equal to Vv6. When programming memory cells to data state S7, the system will test whether those memory cells have a threshold voltage greater than or equal to Vv7.

In one embodiment, known as full sequence programming, memory cells can be programmed from the erased data state S0 directly to any of the programmed data states S1-S7. For example, a population of memory cells to be programmed may first be erased so that all memory cells in the population are in erased data state S0. Then, a programming process is used to program memory cells directly into data states S1, S2, S3, S4, S5, S6, and/or S7. For example, while some memory cells are being programmed from data state S0 to data state S1, other memory cells are being programmed from data state S0 to data state S2 and/or from data state S0 to data state S3, and so on. The arrows of FIG. 5 represent the full sequence programming. The technology described herein can also be used with other types of programming in addition to full sequence programming (including, but not limited to, multiple stage/phase programming). In some embodiments, data states S1-S7 can overlap, with controller 122 relying on ECC to identify the correct data being stored.

Figure 5A:
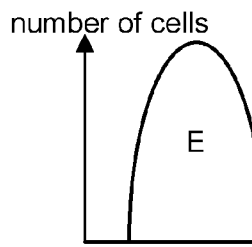
FIGS. 5A-E show various threshold voltage distributions and describe a process for programming non-volatile memory.
Figure 5B:
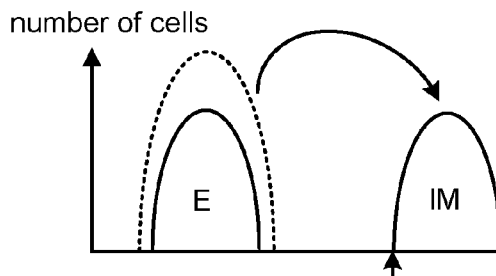

FIG. 5 shows a programming process that includes one phase where all memory cells connected to the same word line are programmed concurrently during that one phase. FIGS. 5A-5E illustrate a multi-phase programming approach. In this embodiment, the programming process includes three phases. Prior to programming, the memory cells are erased so that all memory cells connected to a common word line are in an erased threshold voltage distribution E, as depicted in FIG. 5A. During the first phase of programming, those memory cells whose targets (due to the data to be stored in those memory cells) are data states S4, S5, S6 or S7 are programmed to an intermediate state IM. Those memory cells are targeted for data states S0, S1, S2 or S3 and remain in the erased threshold voltage distribution E. The first phase is graphically depicted by FIG. 5B. Memory cells being programmed to intermediate state IM are programmed to a target threshold voltage of VvIM.

Figure 5C:
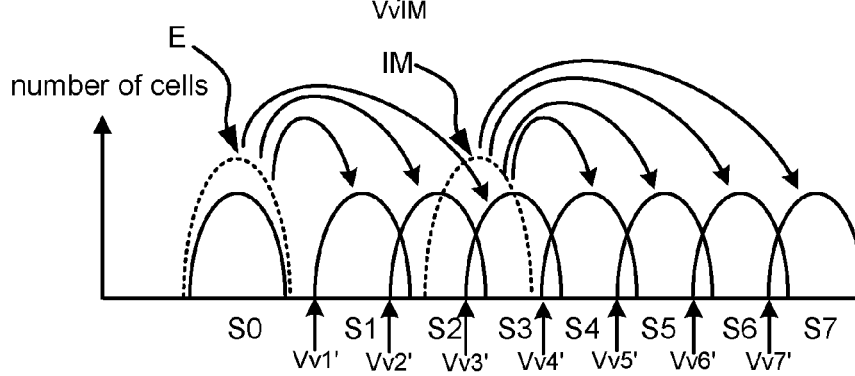
Figure 5D:
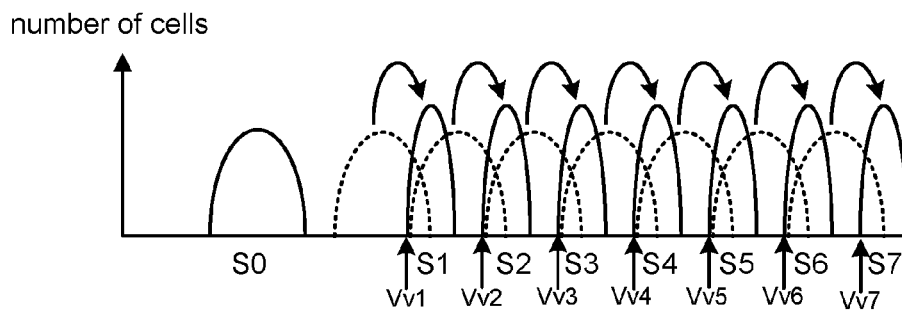
Figure 5E:
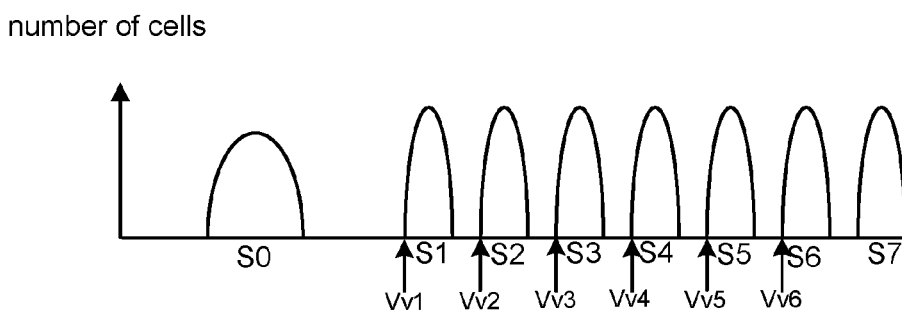

During the second phase of the programming process of FIGS. 5A-E, those memory cells that are in the erased threshold voltage distribution E are programmed to their target data states. For example, those memory cells to be programmed to data state S3 are programmed from erased threshold voltage distribution E to data state S3, those memory cells to be programmed to data state S2 are programmed from erased threshold voltage distribution E to data state S2, those memory cells to be programmed to data state S1 are programmed from erase threshold voltage distribution E to data state S1, and those memory cells to be in data state S0 are not programmed during the second phase of the programming process. Thus, erased threshold voltage distribution E becomes data state S0. Also, during the second phase, memory cells are programmed from the intermediate state IM to various data states S4-S7. For example, those memory cells to be programmed to data state S7 are programmed from the intermediate state IM to data state S7, those memory cells targeted to be in data state S6 are programmed from intermediate state IM to data state S6, both memory cells to be programmed to data state S5 are programmed from intermediate state IM to data state S5, and those memory cells to be programmed to data state S4 are programmed from intermediate state IM to data state S4. This second phase of programming is illustrated in FIG. 5C.

As can be seen in FIG. 5C, at the end of the second phase of programming data states S1-S7 overlap with neighboring data states. For example, data state S1 overlaps with data state S2, data state S2 overlaps with data states S1 and S3, data state S3 overlaps with data states S2 and S4, data state S4 overlaps with data states S3 and S5, data state S5 overlaps with data states S4 and S6, and data state S6 overlaps with data states S5 and S7. In some embodiments, all or some of the data states do not overlap.

In the third phase of programming, each of data states S1-S7 are tightened so that they no longer overlap with neighboring states. This is depicted graphically by FIG. 5D. The final result of the three phrase programming process is depicted in step 5E, which shows data states S0-S7. In some embodiments, data state S0 is wider than data states S1-S7. FIG. 5F shows one example of how data is encoded for the data states of FIGS. 5A-E.

In some embodiments, those memory cells to be programmed to data state S4 are not programmed during the second phase and, therefore, remain in intermediate state IM. During the third programming phase, the memory cells are programmed from IM to S4. In other embodiments, memory cells destined for other states can also remain in IM or E during the second phase.

FIGS. 6A-6B depict a shared region of a group of memory cells. For example, FIGS. 6A-6B depict a channel region of a column (e.g., 432 or 434) of memory cells (formed in a memory hole for example) in one example. FIGS. 6A-6B illustrate the resistive effects of programming and verifying on the channel region for a column of memory cells such as a NAND string. During verification operations, electrons may become trapped in the polysilicon material forming the channel of the memory cell. For instance, a cell current through a string of non-volatile memory cells as part of the verification operation may result in electron trapping in a polysilicon channel material. The accumulation of electrons in the channel material may lead to a lowering of the threshold voltage of the memory cells formed using the channel material. This lowered threshold may result from a reduced resistance of the channel that occurs with the accumulation of electrons.

In FIG. 6A, the channel region of the column 602 of memory cells is illustrated in a steady state condition prior to programming. The column 602 is illustrated prior to an associated verification or read operation. Prior to a cell current passing through the channel, the memory channel resistance RMH is relatively high. In FIG. 6B, a cell current is passed through the channel as may occur during sensing associated with read or verification operations. This cell current causes electron trapping in the channel, resulting in a lowered resistance of the memory hole.

After program verification or reading, electrons may become de-trapped or recombine. It has been observed that the memory channel resistance may decrease over time after verification. The de-trapping or recombination of electrons can result in an increase in the fail bit count as the threshold voltages of the memory cells are lowered over time. The trapping and de-trapping of electrons may result in an apparent variable read current which causes user read errors. These errors may increase significantly when there is a large delay between programming and reading.

Although charge trapping and de-trapping is described with respect to a shared region comprising a channel of a vertical NAND structure, such phenomena may be experienced by other groups of memory cells. For example, charge trapping and de-trapping may occur for groups of resistive memory cells in a ReRam device or groups of floating gate memory cells in a NOR structure.

FIG. 7A is a chart illustrating an example of the fail bit count for various blocks of memory cell groups when being read. In the described example, two read operations are performed following a program operation. The first read operation, represented by dotted line 606, is performed after a delay following a preceding program operation. The second read operation, represented by solid line 604, follows the first read operation. As illustrated, the number of cells which are read in error is generally much higher for the first read than for the second read. This is particularly the case where the length of delay following the program operation is significant. The first read is found to be more erroneous compared with the second read where the delay between programming and the first read is much larger than the delay between the first read and the second read.

The first read operation error may result from electron de-trapping or recombining in the memory cell channel after sensing as part of program verification. Over time, the number of electrons trapped in the channel decreases as a result of de-trapping or recombination. Trapping and de-trapping of electrons in the channel polysilicon may result in a variable read current which can cause these read errors. The number increases over time resulting in an increase in the fail bit count. A delay after programming allows the trapped electrons to de-trap, leading to read errors.

The second read operation may appear less erroneous due to the first read operation mimicking or otherwise simulating the verify operation that followed programming. The first read operation generates a cell current that itself may cause electron trapping in the channel.

If additional delay is introduced after the first read operation, the fail bit count may be expected to increase. Electrons may again detrap or recombine in the channel and again increase the channel resistance. Thus, the fail bit count for a second read operation following a first read operation can be expected to increase if a delay is introduced between the first read operation and the second read operation.

FIG. 7B is a chart showing an example of a FBC for both the first read operation and the second read operation as a function of the time delay between the first read operation and the second read operation. The first read operation is performed after programming the set of memory cells. The second operation is performed following the first read operation by a time delay which varies as shown along the x-axis. The FBC for the first read operation exhibits a substantially constant FBC at around 45. The FBC for the first read does not appear to vary as a function of the delay between the first read and the second read. The FBC for the second read operation, however, shows a clear correlation with the time delay between the first and second read operations. As the time delay increases, the FBC increases for the second read operation.

One explanation is that electrons begin to recombine or detrap in the channel following the first read operation. The first read operation generates a cell current which sets a resistance of the channel based on an amount of electron trapping. The electrons detrap or recombine over time. Additional time leads to detrapping of additional electrons. This may lead to a resistance of the channel that increases over time as the electrons detrap. In turn, the increased resistance may increase the apparent threshold voltage of the associated memory cells during the second read operation. The longer the time since the first read operation, the more read errors that may occur. Eventually, the amount of error reaches a substantially steady state condition.

In accordance with one embodiment, a sensing process is provided that includes passing a current through a group of memory cells prior to sensing for one or more target states. The current can at least partially mimic the cell current of a previous verification or read operation in an effort to place the threshold voltage of a memory cell closer to its state prior to electron de-trapping or recombining. The current may result in electron trapping within a channel or other region for a group of memory cells, similar to electron trapping that may occur during verification or a previous read operation. In this manner, the threshold voltage of the memory cells of the channel region can be placed closer to their levels following the original verification operation. This may result in a reduction of the fail bit count associated with the set of memory cells. The current may be any current hat passes through the memory cells. The current enters the group on one side and exits on another. The current can pass through any shared region of a group of memory cells in one embodiment.

Figure 8:
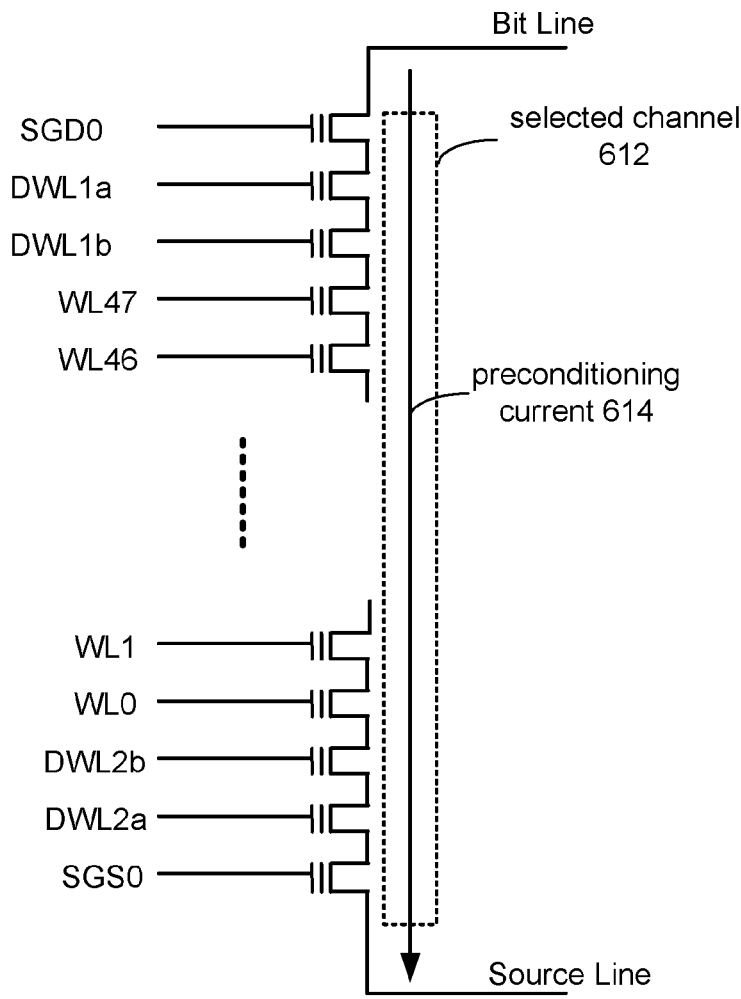
FIG. 8 is a circuit diagram of a selected NAND string depicting a preconditioning current in one embodiment.

FIG. 8 is schematic view of a portion of a NAND string such as that depicted in FIGS. 4A-4G. FIG. 8 depicts the channel 612 of the NAND string adjacent to the string of memory cells. An example of a current 614 such as a current spike that may precede a sense operation in accordance with one embodiment is depicted. Current 614 may be passed from the bit line to the source line through the channel for the memory cells. This current may be provided at a level and/or duration that mimics a cell current that may occur during sensing for a read or verification operation. Current 614 may result in electron trapping within channel 612. The electron trapping may be similar that which occurs as a result of the cell current during a read operation or verification operation, for example. The electron trapping reduces the threshold voltage of the memory cells in an effort to reduce the fail bit count for a subsequent read operation.

In another example, current 614 may be passed through a group of ReRam resistive or other memory elements, entering the group from one side and exiting from the other. The current may be passed through other groupings of memory elements such as NOR memory cells.

Figure 9:
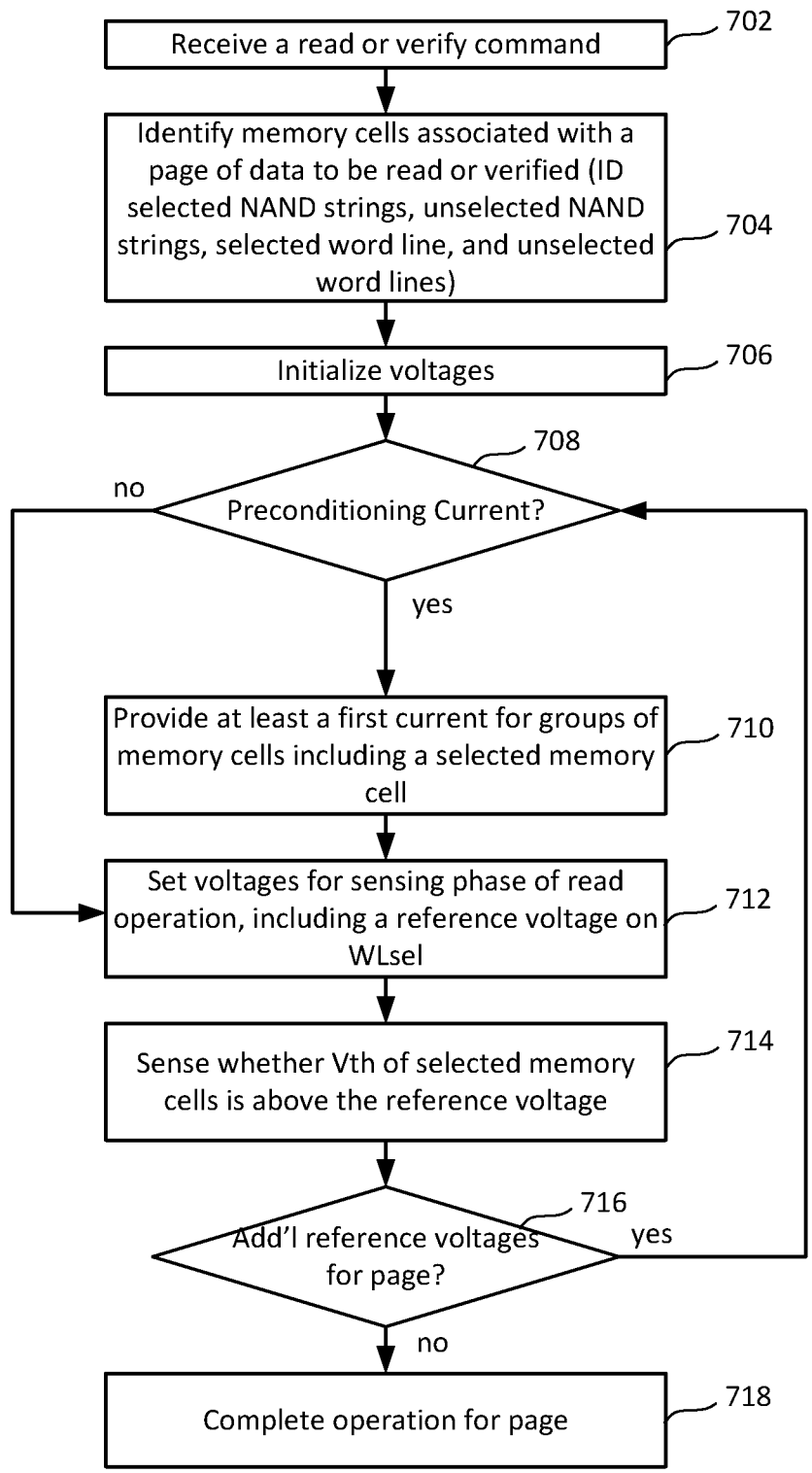
FIG. 9 is a flowchart describing a process of performing a read operation in one embodiment.

FIG. 9 is a flowchart describing a process of performing a read operation in one embodiment. In one example, the process of FIG. 9 may be performed by a non-volatile storage system, such as non-volatile storage system 100 in FIG. 3. The process of FIG. 9 can be performed by state machine 112, control circuitry 110, controller 122 and/or any of the one or more control circuits described above.

At step 702, the system receives a read or verify command. A read command may be a read command received from a host, or a read command passed internally within the storage system, for example between controller 122 and R/W circuits 128 and/or control circuitry 110. The read command may specify a memory address or a range of memory addresses to be read from the non-volatile storage system. At step 704, a plurality of memory cells is identified in response to receiving the read or verify command. The plurality of memory cells may be associated with a page of date to be read or verified. The plurality of memory cells may be a set of memory cells connected to a common word line. The plurality of memory cells may include a first memory cell that is part of a first NAND string or another group of connected memory cells. The NAND memory array may include a NAND flash memory structure, such as a vertical NAND structure or a bit cost scalable (BiCS) NAND structure. By way of non-limiting example, the page of data may comprise 1 KB or 2 KB of data. Identifying the plurality of the memory cells can include identifying selected NAND strings, unselected NAND strings, selected word lines, and unselected word lines in one embodiment. For example, the selected word line may be a selected word line layer in a stacked 3D memory device, and the unselected word lines may include the remaining word line layers. Although the process of reading or verifying a single page of data is described, additional pages may be identified at step 704 and read or verified concurrently or in sequence with the described page using steps 704-718.

At step, 706, the system initializes voltages for the sense operation. For example, the system can initialize various select gates, word lines, bit lines, and source lines to voltages to begin the operation. At step 708, the system determines whether a preconditioning current is to be applied before sensing at the current reference level. In some instances, such as for subsequent reads or at certain temperatures as described hereinafter, an accompanying preconditioning current may not be applied to the memory cells' channel prior to sensing. Accordingly at step 708, the system determines whether a preconditioning current is to be applied before sensing. The preconditioning current is a current spike passed through the channel for one or more selected groups of memory cells such as NAND strings. The current spike includes a current applied at a particular level and duration.

If a preconditioning current is to be used, by applying a current spike for example, the system provides at least a first current for each group of a memory cells including a selected memory cell at step 710. The system may generate a current spike in the channel for each selected NAND string, such as each string including a selected memory cell of the page being sensed. The page may correspond to a set of memory cells sharing a common word line in one example. The set of memory cells may include one or more memory cells from a plurality of NAND strings connected to the selected word line. In another example, the current spike may be generated in a shared region for a group of ReRam or NOR storage elements.

At step 712, the system sets the voltages for the sensing phase of the operation. Step 712 includes setting a read reference voltage or verify reference voltage for the selected word line during the sense phase corresponding to a state being read or verified. For example, the system may apply Vr1, Vr2, Vv1, Vv2, etc. as shown in FIG. 5 to a selected word line at step 712. Step 712 may also include setting various read pass voltages, select gate, bit line, and source line voltages. At step 714, the system senses whether the threshold voltages of the selected memory cells are above the reference voltage. After biasing the memory for reading or verifying, the system senses a current through each selected NAND string for a sense time.

At step 716, the system determines whether there are additional reference voltages to be applied for the page. If so, the process returns to step 708 to determine whether a preconditioning current is to be applied before sensing at the next reference voltage. In one embodiment, the system only applies a preconditioning current before the first of a series of reference voltages.

As illustrated in FIG. 7B, the fail bit count immediately following a previous read or verify operation is relatively low, and increases with the delay since the last sensing. Accordingly, one embodiment includes performing sensing at additional read reference voltages for a page associated with a selected word line without an associated current spike. After applying the current spike before the first reference voltage, such as that in a series of read or verify reference voltages for a page, the FBC may remain low for some time. Accordingly, the reference voltages applied after the initial reference voltage may be applied without generating an associated current spike in the channel. As described hereinafter, additional operations such as for a second page following a first page of the same word line may also be performed without an associated current spike.

If there are no additional reference voltages to be applied for the operation, the operation completes at step 718. Data for a read operation may be determined from the results of sensing at one or more read reference voltages. The data may be determined by control circuitry 110 or controller 122, for example. The data read from the plurality of memory cells may be output from the memory system to a host for example.

FIG. 10 is a timing diagram describing waveforms during a read or verify operation according to one embodiment. The waveforms may be used to generate a preconditioning current spike in the channel of a group of memory cells, such as a NAND string. The waveforms include a preconditioning voltage pulse applied to the bit lines for the selected NAND strings while providing a conduction path through the channel of the NAND string. This results in a current from the bit line to source line through the selected NAND string that is applied prior to a read reference voltage. The current is applied before applying the sensing voltage to the selected word line for comparing the threshold voltage VTH of the storage elements to a compare point (e.g., the read reference voltage level). The current mimics a cell current during a verify or read operation, resulting in electron trapping within the channel. It is noted that the waveforms in FIG. 10 are not necessarily drawn to scale. As described in more detail hereinafter, the preconditioning current can be applied at various levels and/or durations. Moreover, the current spike can be applied before any read operation or only select read operations. The preconditioning current may also be combined with multiple reads at the same voltage level.

In general, during read and verify operations the selected word line or other control line is connected to a voltage (e.g., read reference voltage Vr1, Vr2, etc.), a level of which is specified for each read and verify operation, in order to determine whether a threshold voltage of the concerned storage element has reached such level. After applying the word line voltage, the conduction current of the storage element is measured to determine whether the storage element turned on. If the conduction current is measured to be greater than a certain value, then it is assumed that the storage element turned on and the voltage applied to the word line is greater than the threshold voltage of the storage element. If the conduction current is not measured to be greater than the certain value, then it is assumed that the storage element did not turn on and the voltage applied to the word line is not greater than the threshold voltage of the storage element.

There are many ways to measure the conduction current of a storage element during a read or verify operation. In one example, the conduction current of a storage element is measured by the rate it allows (or fails to allow) the NAND string that included the storage element to discharge the bit line. The charge on the bit line is measured after a period of time to see whether it has been discharged or not. In another embodiment, the conduction of the selected storage element allows current to flow or not flow on a bit line, which is measured by whether a capacitor in the sense amplifier is charged due to the flow of current.

In particular, waveform 750 depicts a selected bit line voltage, waveform 752 depicts a drain side select gate SGD voltage for a NAND string for which a current spike is enabled, waveform 754 depicts an SGD voltage for a NAND string for which a current spike is disabled, waveform 756 depicts an unselected word line and dummy word line voltage, waveform 758 depicts a selected word line voltage (of the word line selected for reading/verification), waveform 760 depicts a source side select gate SGS voltage for a NAND string for which a current spike is enabled, waveform 762 depicts an SGS voltage for a NAND string for which a current spike is disabled, and waveform 764 depicts a source line voltage. Time points t1-t7 extend in the horizontal direction depicting a forward progression of time.

Prior to time t0, the voltages start or are initialized at a steady state voltage, Vss for example, of approximately 0V. At time t1, SGD is raised to Vcc to enable a current spike in an associated channel. Vcc is just one example of a voltage that can be used. Vcc is equal to an external power supply level (e.g., 2.7 to 3.6V). In order to disable a current spike in an associated channel, SGD is raised to Vsg. In one embodiment, Vsg is equal to about 3.5V. Also at time t1, SGS is raised to Vcc to enable a current spike in an associated channel. SGS is raised to Vsg to disable a current spike in an associated channel. The applied voltages remain through time t2 to allow steady state conditions, but various times before applying the next voltage levels may be used.

At time t3, the preconditioning current is applied to the selected NAND strings. The selected bit line is raised to a voltage Vspike. Vspike may vary by embodiment. Moreover, additional values of Vspike within a memory system may be used, based on conditions such as temperature and time delay for example. In one embodiment, Vspike is about 0.2V. In another example, Vspike is any voltage greater than 0V. SGD (enable) is raised from Vcc to Vread. In one embodiment, Vread is approximately 6.0V, but any value of Vread may be used. Generally, Vread is a voltage that is higher than any threshold voltage to which a memory cell may be programmed in order to ensure that unselected memory cells and other elements of the string are conductive during sensing. Vread acts as an overdrive voltage because it causes the unselected storage elements to turn on and act as pass gates. Vread in many cases is the highest voltage that can be applied without causing disturbs.

SGD (disable) is raised from Vsg to Vsg+DV. In one embodiment, Vsg+DV is approximately 4.0V, but other values may be used. Also at time t3, the unselected word lines and dummy word lines are raised to Vread. Additionally, the selected word line is raised to Vread. Finally, SGS (enable) is raised from Vcc to Vread and SGD (disable) is raised from Vsg to Vsg+DV. The biasing at time t3 provides a conduction path through the selected NAND strings. Each of the memory cells within the NAND string are turned on by application of Vread. Moreover, the selected select gates coupled to SGS and SGD are turned on by application of Vread. With a positive voltage Vspike applied on the selected bit lines while the source lines are grounded, a current is induced from the bit line to the source line through the channel of the selected groups of memory cells. Additionally, applying Vread on the selected word line may provide a precondition voltage to the memory cells of the selected word line.

At time t4, the preconditioning phase completes. The preconditioning current is removed from the channels of the selected NAND strings. For the selected word line, the voltage Vread is removed and the word line voltage is reduced to 0V. This turns off the selected memory cells and stops the preconditioning current from flowing from the bit line to the source line. The remaining voltages remain at the respective levels at time t3.

At time t5, the selected bit line is raised from Vspike to a precharge voltage Vpre. In one example, Vpre is approximately 0.7V but other voltages may be used. Vpre is a precharge voltage for the bit line used during sensing. In the described example, the precharge voltage may be used to measure the conduction current of a storage element by determining whether the bit line discharges during a sense time. In another example, the precharge voltage may be held constant and the conduction current can be measured by the rate it discharges a dedicated capacitor in a sense amplifier.

Also at time t5, the selected word line is raised to Vcgr (control gate read voltage) for a read or verify operation. The waveform applied to the selected word line between time t5 and t6 may be considered a read pulse or a read reference voltage which is used during a sense operation. The voltage level of Vcgr varies according to the particular state being sensed. For example, Vcgr may be set to Vr1, Vr2, Vr3, etc. to sense at various target states during reading, or to Vv1, Vv2, Vv3, etc. to sense at various verify levels for target states during programming.

At time t6, the NAND string is allowed to control the bit line in order to sense the selected memory cell for the target state. A path is provided to dissipate the charge on the bit line through the NAND string. If the threshold voltage VTH of the selected memory cell of the NAND string for reading is greater than Vcgr, then the selected memory cell will not turn on or otherwise be conductive from source to drain. The bit line (or sense amplifier capacitor) will not discharge as shown by line 751. If the threshold voltage VTH of the selected memory cell is below Vcgr, then the selected memory cell will turn on and conduct from source to drain. The bit line will discharge as shown by line 753. If a capacitor discharge technique is used, the bit line voltage will remain constant while the sense amplifier capacitor discharges to indicate a conductive memory cell. At some time following t5, the sense amplifiers determine whether their associated bit lines (or sense capacitors) have discharged or otherwise dissipated by a sufficient amount. The sense amplifiers evaluate the BL or capacitor voltage to determine if the memory cell has a threshold above or below the compare point for the sense operation. At time t7, the waveforms are lowered to Vss (or another level) for standby or recovery.

Figure 11:
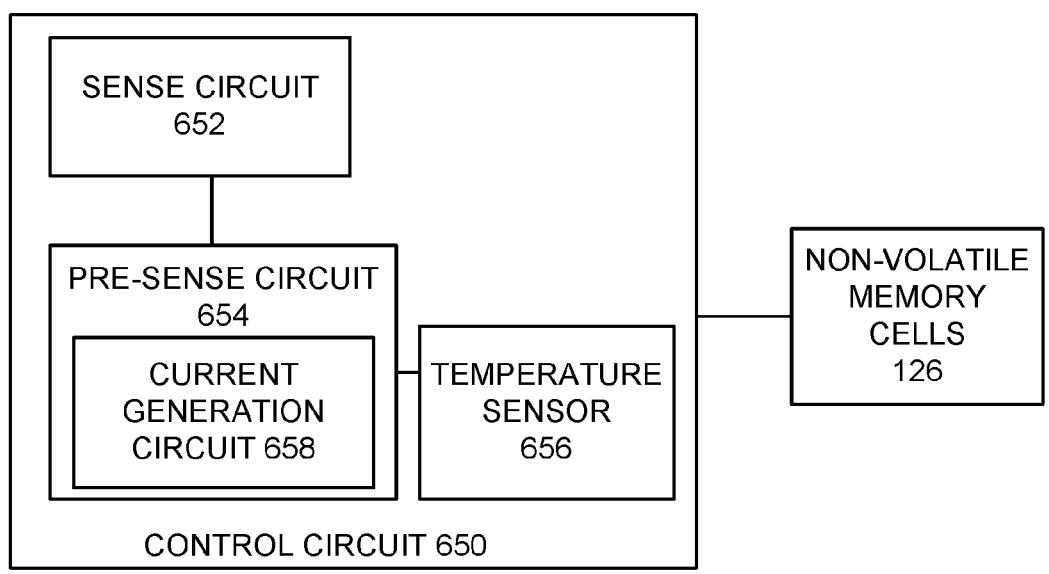
FIG. 11 is a block diagram of a memory device in one embodiment.

FIG. 11 is a block diagram of one example of a set of components that can perform the process of FIG. 8. FIG. 11 is also an example of components that can be used to generate a preconditioning current for a sense operation, as shown in FIG. 10 for example. FIG. 11 depicts control circuit 850 in communication with non-volatile memory cells 126. In one embodiment, memory cells 126 can include memory cells in a two dimensional structure or three dimensional structure (e.g., such as the structure depicted in FIGS. 4A-F). Any of various non-volatile technologies known in the art can be used to implement memory cells 126. Control circuit 650 includes sense circuit 652, pre-sense circuit 654, and temperature sensor 656. Pre-sense circuit 654, in one embodiment, includes current generation circuit 658. In another example, current generation circuit is a standalone circuit apart from pre-sense circuit 654. Sense circuit 652 is connected to the memory cells and is configured to perform a sense process as part of reading or verifying for the memory cells, as described herein. In one embodiment, sense circuit 652 performs step 702, 704, 706, 712, 714, 716, and 718 of FIG. 9. In one example, sense circuit 652 also performs step 708. Various means for sensing (sensing means) may be used to determine a programmed state of a selected memory cells. The sense circuit may be a part of or include a read circuit in one embodiment. The sensing means may include a dedicated circuit within control circuit 650 in one embodiment. The sensing means may also or alternately include software control means implemented with a processor or logic circuitry for example. The sensing means may include reading means for performing multiple read operations to read various pages of data from a selected set of memory cells. The reading means may include means for applying one or more sets of read reference voltages to the selected memory cells in order to determine a programmed state of the selected memory cells. The reading means may apply to a selected word line one or more of a plurality of read reference voltages associated with a particular page of data in association with a read operation after current generation means generates a current in the channel for one or more groups of memory cells. The sensing means may include verifying means for performing multiple verify operations to verify one or more pages of data.

Pre-sense circuit 654, also connected to the memory cells, is configured with current generation circuit 658 to generate the preconditioning current for a sense operation. In one embodiment, pre-sense circuit 654 performs step 708 and current generation circuit 658 performs step and 710 of FIG. 9. Various means for generating a current (current generation means) may be used to generate at least a first current through the channel of a group of memory cells such as a NAND string. The current generation means may include a dedicated circuit within control circuit 650 in one embodiment. The current generation means may also or alternately include software control means implemented with a processor or logic circuitry. The current generation means may include control logic and/or circuitry for applying voltages to a memory array to induce or otherwise cause a current flow in a select portion of the array. In one example, current generation circuit 658 is configured to generate a set of preconditioning waveforms including a bit line voltage to induce a current in the channel of a selected group of memory cells. Although shown locally as part of control circuit 650, current generation circuit 658 may be formed internally as part of the memory system or as an external component of the memory system. In one embodiment, current generation circuit 658 may be a local circuit or generator, formed as part of memory die 108 for example. In another embodiment, current generation circuit 658 may be an external circuit or generator, for example located at a host or other component. Control circuit 650 may receive a current from any component, internal or external to the memory system. The induced current may be referred to as a current spike, having a pre-determined level and duration which can vary according to embodiment. The current spike may also vary within a memory system, according to temperature, etc. In one example, pre-read circuit 654 is configured to respond to sense circuit 652, to produce a pre-conditioning current prior to sensing at one or more reference levels.

Temperature sensor 656 is connected to the sense circuit and optionally the current generation circuit. The temperature sensor is used to determine a temperature at a time of sensing. As described hereinafter, the detected temperature may be used to conditionally apply preconditioning currents and/or to generate different current durations and/or sizes. The temperature sensor may include an analog temperature detector with accompanying circuitry to interface with control circuit 650. In one embodiment, a digital temperature sensor is used.

In one example implementation, sense circuit 652, pre-sense circuit 654, current generation circuit, 658, and temperature sensor 856 are electrical circuits that are implemented on the same semiconductor chip as non-volatile memory cells 126. In other embodiments, sense circuit 652, pre-sense circuit 654, current generation circuit 658, and temperature sensor 656 can be implemented on a separate semiconductor chip. In one embodiment, sense circuit 652, pre-sense circuit 654, current generation circuit 658, and temperature sensor 656 are implemented as one single electrical circuit that can perform the multiple functions. For example, that single electrical circuit is referred to as control circuit 650 in FIG. 11. In one example, control circuit 650 can be implemented by state machine 112, control circuitry 110, and/or controller 122, or any one or more of the control circuits described above, or another circuit in the memory system.

As shown in FIG. 7A, detrapping or recombination of electrons over time may lead to a larger apparent threshold voltage of the associated memory cells. Accordingly, a first read operation following a significant delay since a last programming operation may see a consistently larger fail bit count when compared with a second read operation that closely follows the first read operation. The second read operation may benefit from the cell current generated in the channel during reading. The cell current during the first read operation mimics the cell current during program verification, which may lead to electron accumulation in the channel that approximates the levels in the channel after program verification.

This is further illustrated in FIG. 7B, which shows the FBC for both the first read operation and the second read operation as a function of a delay between the first read operation and the second read operation. If the first read operation is performed after a long delay since programming and the second operation closely follows the first read operation, the second read operation may experience improved read error by virtue of the preceding first read operation. In FIG. 7B, the time delay between the first and second read operations are shown along the x-axis for one example. The FBC for the first read operation exhibits a consistent FBC as would be expected. The FBC for the second read operation shows a clear correlation with the time delay since the first read operation. As the time since the first read operation increases, the FBC increases for the subsequent read operation.

Accordingly, one embodiment includes selectively applying a preconditioning current for a group of memory cells based on the time since a previous read operation. For example, the first read operation for a first page from a group of memory cells may include an associated preconditioning current. A second read operation that follows the first read operation, for a second page from the group of memory cells, for example, may not include an associated preconditioning current. Because the first read operation includes generating a cell current through the selected NAND strings, the second read operation may be expected to have a lower fail bit count such that the preconditioning current can be skipped. In this manner, power may be saved by generating the preconditioning current fewer times. Moreover, performance can be increased by limiting the number of times that the additional preconditioning phase is applied.

Accordingly, one example includes applying a first plurality of read reference voltages associated with a first page after applying a preconditioning current, and applying a second plurality of read reference voltages associated with a second page without applying an associated preconditioning current. With reference to FIG. 5F for example, a preconditioning current may be applied before reading the lower page. The current may be applied, followed by applying Vr1 and Vr5 to read the lower page. If the middle page is then read, an additional preconditioning current is not applied before applying Vr2, Vr4, and Vr6 to read the middle page. If the upper page is then read, an additional preconditioning current is not applied before applying Vr3 and Vr7 to read the upper page.

Figure 12:
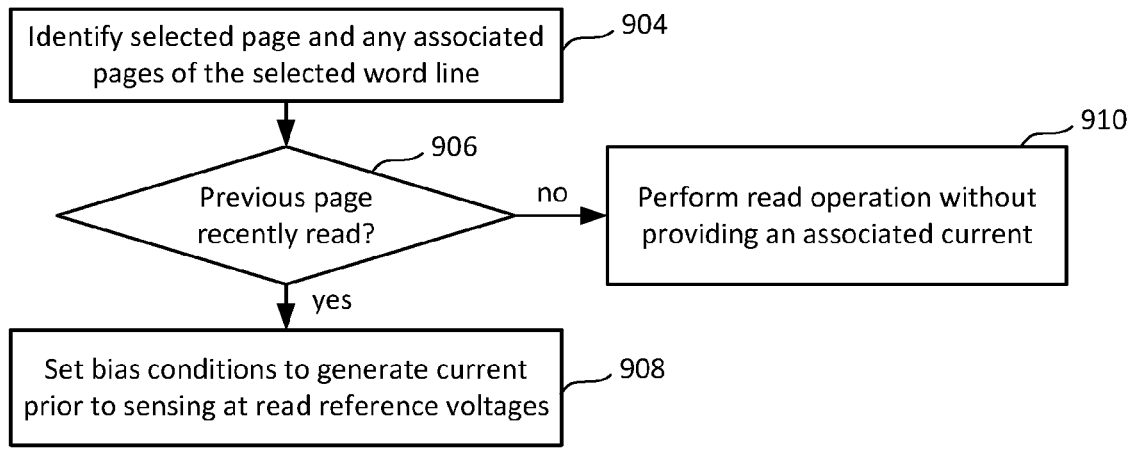
FIG. 12 is a flowchart describing a process of performing a read operation with a selective preconditioning current in one embodiment.

FIG. 12 is a flowchart describing a process of selectively applying a preconditioning current during reading. In FIG. 12, a preconditioning current is applied when reading a first page from a set of memory cells, such as those connected to a common word line. A preconditioning current is not applied when reading a second page from the same set after reading the first page. In one embodiment, the process of FIG. 12 can be performed at step 708 of FIG. 9 in determining whether to apply a preconditioning current. In one embodiment, steps 904 and 906 can be performed by pre-read circuit 654, while step 908 is performed by current generation circuit 658 and step 910 is performed by read circuit 652.

At step 904, the system identifies the selected page and any pages associated with the selected page. For example, the system may identify the selected page and determine any other pages associated with the same word line as the selected word line. At step 906, the system determines whether another page associated with the selected word line has recently been read. The system may determine at step 906 when the previous page was read and whether the current read operation is within a threshold time since the previous read operation. If the system determines that a previous page was read from the selected word line, the read operation for the current page is performed at step 910 without providing an associated current through groups of memory cells containing a selected memory cell. If the system determines that a previous page has not been read recently, the read operation for the current page is performed at step 908 by providing an associated current through the groups of memory cells containing a selected memory cell, such as through the channel regions of selected NAND strings prior to applying one or more read reference voltages to the selected word line.

In another example, the system is configured to automatically perform a first read operation for a first page of a selected word line (e.g., lower page) using a preconditioning current and to perform any subsequent reads for other pages (e.g., middle and upper page) without using a preconditioning current. Additionally, the system in one embodiment may utilize time delay information to determine whether to read a first page from a selected word line. For example, the system may determine if the first page was read from the selected word line recently or whether the selected word line had recently been programmed. If these conditions are met, the system may read the first page without providing an associated current in the channel. It can be expected the cell current during the previous read operation or verification operation will lead to electron accumulation in the channel such that an additional preconditioning current is not needed.

Figure 13A:
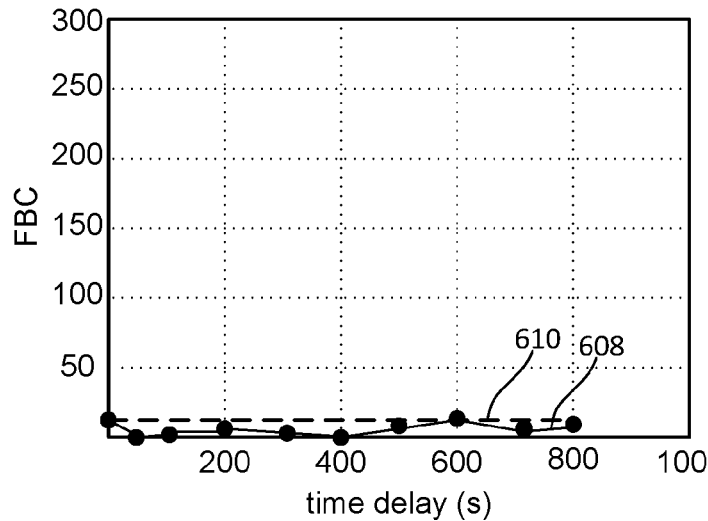
FIGS. 13A-13C are charts illustrating the fail bit count for a group of memory cells as a function of time delay at different temperatures.
Figure 13B:
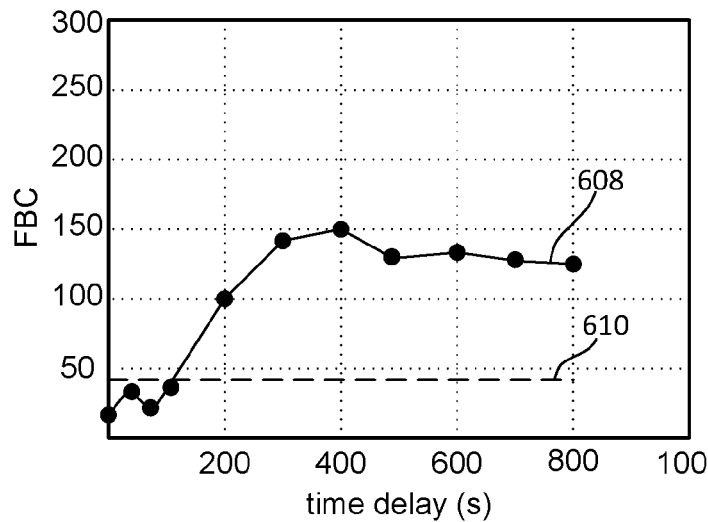
Figure 13C:
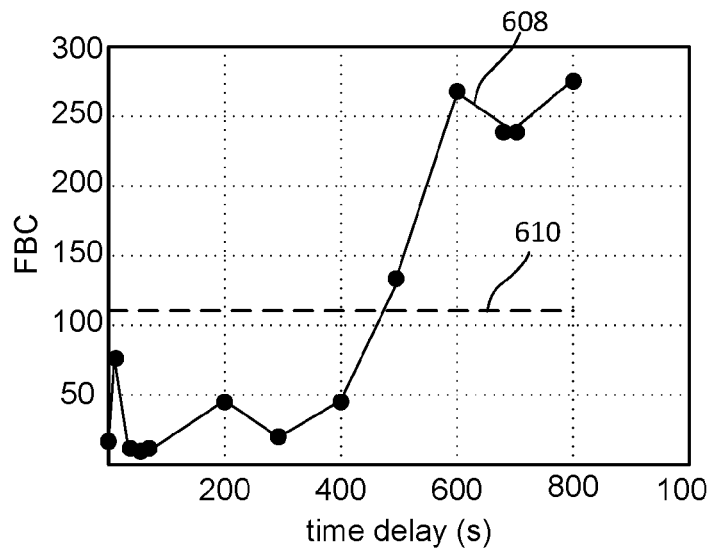

FIGS. 13A-13C are charts illustrating the fail bit count of a group of memory cells. FIG. 13A shows the FBC when reading at a temperature of 85 C, FIG. 13B shows the FBC when reading a temperature of 25 C, and FIG. 13C shows the FBC when reading at a temperature of 0 C. In each chart, the FBC is illustrated as a function of the time delay between the first read operation shown by line 610, and a second read operation shown by line 608. The second read operation, represented by the solid line 608, follows the first read operation by a time delay shown along the x-axis.

In FIG. 13A, the fail bit counts for both the first read and the second read are relatively low at the high temperature. The fail bit counts for both read operations are less than 10. Accordingly, it can be expected that the phenomena of a time dependence for either read operation will be low or not present at low temperatures. At such temperatures, a preconditioning current may not result in meaningful decreases in FBC. Moreover, the value of such decreases may not favor the increase in power and time requirements.

In FIG. 13B at 25 C, the fail bit counts for both reads increases significantly. For the first read 610, the fail bit count is constant or relatively constant across the various time delays between reads. The fail bit count is constant at about 45. The fail bit count for the second read, however, varies significantly with the time delay between read operations. The fail bit count for the second read increases as the time delay increases. As the read operation is delayed, more electrons may detrap, leading to an increase in the threshold voltage of the memory cells.

In FIG. 13C at 0 C, the fail bit counts for both reads again increase significantly as the temperature is decreased. For the first read, the fail bit count is constant or relatively constant across the various time delays. The fail bit count is constant at about 110. The fail bit count for the second read varies with the time delay and increases as the time delay following the first read increases.

FIGS. 13A-13C illustrate that a large difference in the FBC between first and second read operations is not present at high temperatures. As the temperature is decreased, however, both read operations experience a larger FBC. Moreover, the second read operation shows a clear time dependence based on the delay following the first read operation. At lower temperatures, the FBC of the second read operation is much higher than that of the first read operation. These charts illustrate that low temperature reads are most affected by the detrapping issue. In this manner, the use of a preconditioning current can be based on the temperature when reading. The use of a preconditioning current can be limited to lower temperature read processes. At higher temperatures, reading can progress without a preconditioning current to improve performance and decrease power consumption associated with current generation.

Figure 14:
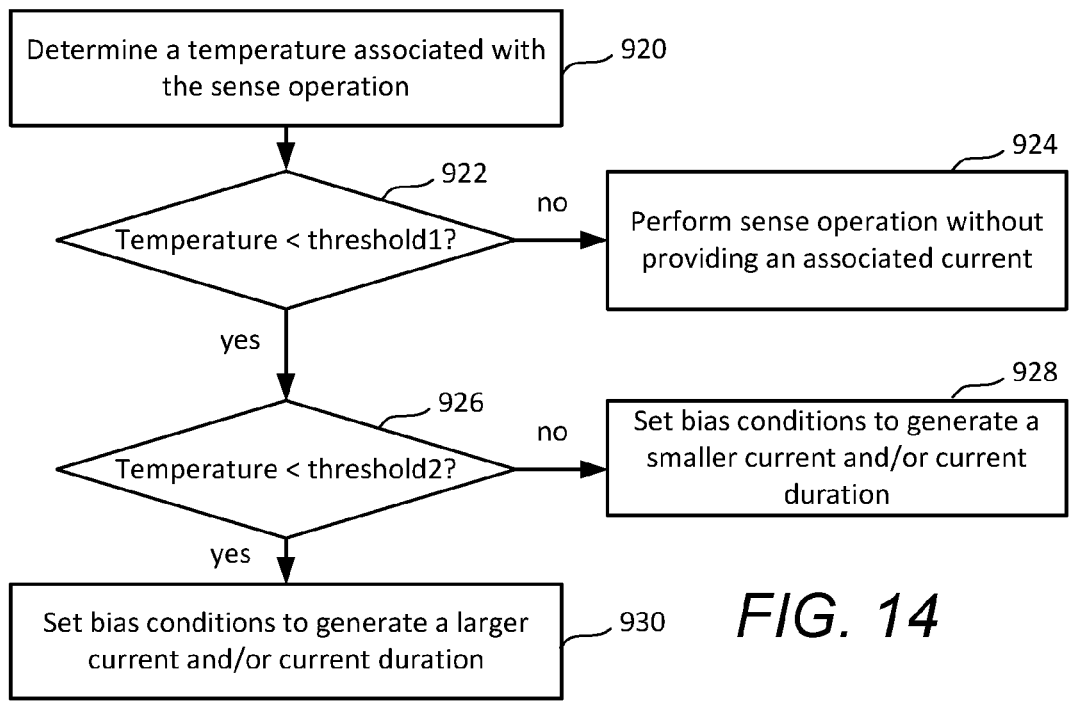
FIG. 14 is a flowchart describing a process of performing a read operation with a selective preconditioning current in one embodiment.

FIG. 14 is a flowchart describing a process of selectively applying a preconditioning current during sense operations based on temperature. In FIG. 14, a preconditioning current is applied when sensing at lower temperatures, but not when sensing at higher temperatures. In one embodiment, the process of FIG. 14 can be performed at step 708 of FIG. 9 in determining whether to apply a preconditioning current. In one embodiment, step 920 is performed by temperature sensor 656, step 924 is performed by sense circuit 652, steps 922 and 926 are performed by pre-sense circuit 654, and steps 928 and 930 are performed by current generation circuit 658.

At step 920, the system determines a temperature associated with the sense operation. A current temperature (or present time temperature) associated with the plurality of memory cells can be determined. The current temperature may be determined by temperature sensor (e.g., 656) located on a memory die that includes the plurality of memory cells. The present temperature may comprise the temperature at which the plurality of memory cells will be sensed. In one embodiment, pre-sense circuit 654 or sense circuit 652 determines the temperature at step 920 from temperature sensor 656.

At steps 922 and 926, the system determines if the current temperature is less than a first threshold temperature and a second threshold temperature. The first threshold temperature is higher than the second threshold temperature. If the temperature is not below the first threshold temperature, the system performs the sense operation at step 924 without providing an associated current in the channel of the selected NAND strings. If the temperature is below the first threshold temperature, but not below the second threshold temperature, the system performs the sense operation using a smaller current and/or current duration. The current generation circuit 658 sets bias conditions at step 928 to generate a smaller current or a current having a smaller predetermined duration prior to the sense circuit sensing the selected word line. If the temperature is below the second threshold temperature, the system performs the sense operation using a larger current and/or current duration. The current generation circuit 658 sets the bias conditions at step 930 to generate a larger current or a current having a larger predetermined duration as compared with the current at step 928.

FIGS. 13A-13C illustrate that the FBC associated with a sense operation tends to increase as the temperature decreases. Accordingly, the process in FIG. 14 only applies the preconditioning current if the temperature drops below a first level. Otherwise, the system performs the operation without the current to improve performance and save power. Moreover, the system defines ranges of temperatures such that different amounts of preconditioning current can be used based on temperature. If the temperature is low, but above a low threshold (e.g., 0 C), a smaller amount of preconditioning is applied as compared to when the temperature falls below the lower threshold.

A smaller current is generated in one example by applying a lower bit line voltage to generate the channel current. For example, a bit line voltage of 0.1V may be used in one example to generate the current at step 928 and a larger bit line voltage of 0.2V may be used to generate the larger current at step 930. Other techniques for generating a larger current through a group of memory cells such as through a NAND string channel or row or column of ReRam cells may be used. In one embodiment, the voltages applied at steps 928 and 930 may be the same to generate the same preconditioning current, but varying durations of the current may be applied to alter the amount of preconditioning. In one embodiment, the time duration between t3 and t4 when the preconditioning current is generated is increased for lower temperatures.

Variations to the process described in FIG. 14 may be applied. In one example, the system may determine whether or not to apply a preconditioning current based on a single threshold without changing the size or duration of the current based on a second threshold. In another example, the system may apply more than two different currents or current durations based on additional ranges of temperatures. In another example, the system may determine whether to apply a first or second current having different sizes or durations based on a single threshold.

Accordingly, one embodiment includes an apparatus that comprises a plurality of non-volatile memory cells, a pre-sense circuit configured to generate a first current in a channel of the non-volatile memory cells for a predefined duration in response to a first sense operation, and a sense circuit configured to sense a selected non-volatile memory cell of the plurality in response to the first sense operation.

One embodiment includes an apparatus that comprises a plurality of non-volatile memory cells, a current generation circuit configured to generate at least a first preconditioning current through the plurality of non-volatile memory cells in association with a first sense operation, and a read circuit configured to apply a reference voltage to a selected non-volatile memory cell to execute the first sense operation after the current generation circuit generates the at least a first preconditioning current.

One embodiment includes a method that comprises receiving a request to read data from at least one of a group of memory cells, applying to a bit line of the group of memory cells a positive bit line voltage while providing a conduction path through the group of memory cells in response to the read request, applying to a selected non-volatile memory cell of the group at least one of a series of read reference voltages after applying the positive bit line voltage, and determining data for the selected memory cell based on applying the at least one of a series of read reference voltages.

One embodiment includes an apparatus that comprises a bit line, a plurality of word lines, a group of non-volatile memory cells coupled to the bit line and the plurality of word lines, means for generating in association with a first read operation at least a first current from the bit line through the group of non-volatile memory cells, and means for applying to a selected word line at least one of a plurality of read reference voltages in association with the first read operation after generating the at least a first current.

The foregoing detailed description has been presented for purposes of illustration and description. It is not intended to be exhaustive or to limit the subject matter claimed herein to the precise form(s) disclosed. Many modifications and variations are possible in light of the above teachings. The described embodiments were chosen in order to best explain the principles of the disclosed technology and its practical application to thereby enable others skilled in the art to best utilize the technology in various embodiments and with various modifications as are suited to the particular use contemplated. It is intended that the scope of the invention be defined by the claims appended hereto.

What is claimed is:

1. An apparatus, comprising:
   a plurality of non-volatile memory cells;
   a pre-sense circuit configured to generate a first current in a channel of the non-volatile memory cells for a predefined duration in response to a first sense operation; and
   a sense circuit configured to sense based on a cell current of a selected non-volatile memory cell of the plurality after generating the first current in response to the first sense operation, the cell current and the first current are different.

2. The apparatus of claim 1, wherein the pre-sense circuit is configured to generate the first current by:
   applying to a bit line connected to the plurality of memory cells a positive bit line voltage;
   applying at least one positive word line voltage to a plurality of unselected word lines and a selected word line connected to the selected non-volatile memory cell;
   applying to a first select gate and a second select gate at least one positive select voltage; and
   applying to a source line of the plurality of memory cells a source line voltage that is less than the positive bit line voltage.

3. The apparatus of claim 1, wherein:
   the sense circuit is configured to read the selected non-volatile memory cell by applying a first read reference voltage associated with a first page of data of the selected word line;
   the sense circuit is configured to read a second page of data from the selected memory cell after applying the first read reference voltage in association with the first read operation; and
   the sense circuit is configured in association with the second page of data to apply a second read reference voltage to the selected word line without the pre-sense circuit generating an associated current in the channel of the non-volatile memory cells.

4. The apparatus of claim 1, further comprising:
   a temperature sensor configured to determine a first temperature in association with the first sense operation and a second temperature in association with a second sense operation, the first temperature is below the second temperature;
   wherein the pre-sense circuit is configured in response to the first temperature, to generate the first current in the channel of the non-volatile memory cells;
   wherein the sense circuit is configured in response to the first temperature, to sense the selected non-volatile memory cell by applying a reference voltage to the selected word line after the pre-sense circuit generates the first current in the channel of the non-volatile memory cells; and
   wherein the sense circuit is configured in response to the second temperature, to apply the reference voltage to the selected word line without the pre-sense circuit generating an associated current in the channel of the non-volatile memory cells.

5. The apparatus of claim 1, wherein the predetermined duration is a first predetermined duration, the apparatus further comprising:
   a temperature sensor configured to determine a first temperature in association with the first sense operation and a second temperature in association with a second sense operation, the first temperature is below the second temperature;
   wherein in response to the first temperature, the pre-sense circuit is configured to provide the first current in the channel for the first pre-determined duration;
   wherein in response to the second temperature, the pre-sense circuit is configured to provide the first current in the channel for a second pre-determined duration; and
   wherein the first pre-determined duration is longer than the second pre-determined duration.

6. The apparatus of claim 1, further comprising:
a temperature sensor configured to determine a first temperature in association with the first sense operation and a second temperature in association with a second sense operation, the first temperature is below the second temperature;
wherein in response to the second temperature, the pre-sense circuit is configured to generate a second current in the channel of the non-volatile memory cells;
wherein in response to the second temperature, the pre-sense circuit is configured to apply a reference voltage to the selected word line after the pre-sense circuit generates the second current; and
wherein the second current is smaller than the first current.

7. The apparatus of claim 1, wherein:
the sense circuit is configured to read the selected non-volatile memory cell by applying a first read reference voltage to a selected word line connected to the selected non-volatile memory cell after the pre-sense circuit generates the first current;
the sense circuit is configured to read the selected non-volatile memory cell by applying a second read reference voltage after applying the first read reference voltage, the read circuit is configured to apply the second read reference voltage without providing an associated current in the channel.

8. The apparatus of claim 1, wherein:
the plurality of non-volatile memory cells are part of a non-volatile memory array; and
the non-volatile memory array is arranged in a three dimensional structure.

9. The apparatus of claim 1, wherein sensing based on the cell current comprises sensing a voltage based on the cell current.

10. An apparatus, comprising:
a plurality of non-volatile memory cells;
a current generation circuit configured to generate at least a first preconditioning current through the plurality of non-volatile memory cells in association with a first sense operation prior to initiating the first sense operation; and
a read circuit configured to apply a reference voltage to a selected non-volatile memory cell to execute the first sense operation by sensing based on a cell current of the selected non-volatile memory cell after the current generation circuit generates the at least a first preconditioning current, the cell current and the at least a first preconditioning current are different.

11. The apparatus of claim 10, further comprising:
a source line coupled to a first select gate for the plurality of memory cells;
a bit line coupled to a second select gate for the plurality of memory cells; and
a plurality of word lines coupled to the plurality of memory cells;
wherein the current generation circuit is configured to generate the at least a first preconditioning current by applying to the bit line a positive bit line voltage, applying to the plurality of word lines at least one positive word line voltage, applying to the first select gate and the second select gate at least one positive select gate voltage, and applying to the source line of the plurality of memory cells a source line voltage that is less than the positive bit line voltage.

12. The apparatus of claim 10, further comprising:
a temperature sensor configured to determine a first temperature in association with the first sense operation and a second temperature in association with a second sense operation;
wherein in response to the first temperature, the current generation circuit is configured to generate the at least a first preconditioning current;
wherein in response to the second temperature, the read circuit is configured to apply the reference voltage to the selected non-volatile memory cell without a preceding associated preconditioning current being generated through the plurality of non-volatile memory cells; and
wherein the second temperature is above the first temperature.

13. The apparatus of claim 11, wherein:
the sense operation is a first read operation;
the reference voltage is part of a first plurality of read reference voltages for a first page of data associated with the selected word line;
the read circuit is configured to perform a second read operation to read a second page of data from the selected word line after the first read operation; and
the read circuit is configured to apply to the selected word line a second plurality of read reference voltages for a second page of data associated with the selected word line without a preceding associated preconditioning current being generated through the plurality of non-volatile memory cells.

14. A method, comprising:
receiving a request to read data from at least one of a group of memory cells;
in response to the read request, applying to a bit line of the group of memory cells a positive bit line voltage while providing a conduction path from the bit line through the group of memory cells, wherein providing the conduction path includes applying a first voltage to a selected non-volatile memory cell of the group;
after applying the positive bit line voltage, applying to the selected non-volatile memory cell at least one of a series of read reference voltages, the at least one read reference voltage is lower than the first voltage; and
determining data for the selected memory cell based on applying the at least one of a series of read reference voltages.

15. The method of claim 14, wherein:
applying to the selected non-volatile memory cell at least one other of the plurality of read reference voltages without applying to the bit line the positive bit line voltage.

16. The method of claim 14, wherein providing the conduction path through the channel of the group of memory cells comprises:
applying to the group of memory cells at least one positive gate voltage; and
applying to a first select gate and a second select gate for the group of memory cells at least one positive select voltage.

17. The method of claim 16, wherein the request to read data is a first request and the positive bit line voltage is a first bit line voltage, the method further comprises:
determining a first temperature in response to the first request;

receiving a second request to read data from the at least one the group of memory cells;

determining a second temperature in response to the second request, the second temperature is higher than the first temperature;

in response to the second temperature, applying to the bit line a second bit line voltage while providing the conduction path through the group of memory cells, the second bit line voltage is less than the first bit line voltage; and after applying the second bit line voltage, applying to the selected non-volatile memory cell the at least one of the series of read reference voltages.

18. The method of claim 14, further comprising:

in response to the read request, determining a temperature associated with the group of memory cells;

in response to a first temperature, applying the positive bit line voltage for a first time duration; and in response to a second temperature, applying the positive bit line voltage for a second time duration, the second time duration is less than the first time duration, the second temperature is higher than the first temperature.

19. An apparatus, comprising:
 a bit line;
 a plurality of word lines;
 a group of non-volatile memory cells coupled to the bit line and the plurality of word lines;
 means for generating in association with a first read operation at least a first current from the bit line through the group of non-volatile memory cells; and
 means for applying to a selected word line at least one of a plurality of read reference voltages in association with the first read operation after generating the at least a first current.

20. The apparatus of claim 19, wherein the plurality of read reference voltages is a first plurality of read reference voltages for a first page of data associated with the selected word line, the apparatus further comprising:
 means for performing a second read operation to read a second page of data from the selected word line after the first read operation; and
 means for applying to the selected word line a second plurality of read reference voltages for the second page of data without generating a preceding associated current through the group of non-volatile memory cells.

* * * * *